United States Patent
Funayama et al.

(10) Patent No.: US 10,224,240 B1
(45) Date of Patent: Mar. 5, 2019

(54) DISTORTION REDUCTION OF MEMORY OPENINGS IN A MULTI-TIER MEMORY DEVICE THROUGH THERMAL CYCLE CONTROL

(71) Applicants: SANDISK TECHNOLOGIES LLC, Plano, TX (US); KABUSHIKI KAISHA TOSHIBA, Tokyo (JP)

(72) Inventors: Kota Funayama, Yokkaichi (JP); Masayuki Fukai, Yokkaichi (JP); Takaya Yamanaka, Yokkaichi (JP); Masaki Tsuji, Yokkaichi (JP); Akira Matsumura, Yokkaichi (JP)

(73) Assignees: SANDISK TECHNOLOGIES LLC, Addison, TX (US); TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/635,023

(22) Filed: Jun. 27, 2017

(51) Int. Cl.
| | |
|---|---|
| *H01L 21/768* | (2006.01) |
| *H01L 27/11524* | (2017.01) |
| *H01L 27/11556* | (2017.01) |
| *H01L 27/1157* | (2017.01) |
| *H01L 27/11582* | (2017.01) |

(Continued)

(52) U.S. Cl.
CPC .. *H01L 21/76877* (2013.01); *H01L 21/76816* (2013.01); *H01L 23/528* (2013.01); *H01L 23/5226* (2013.01); *H01L 23/5329* (2013.01); *H01L 27/1157* (2013.01);
(Continued)

(58) Field of Classification Search
CPC ......... H01L 21/76828; H01L 27/11556; H01L 27/1157; H01L 21/76877; H01L 27/11524; H01L 23/528; H01L 27/11582; H01L 23/5226; H01L 23/5329; H01L 21/76816; H01L 27/11514; H01L 27/11521;
(Continued)

(56) References Cited

U.S. PATENT DOCUMENTS

| | | | |
|---|---|---|---|
| 5,915,167 A | 6/1999 | Leedy | |
| 8,884,357 B2 | 11/2014 | Wang et al. | |

(Continued)

OTHER PUBLICATIONS

Endoh et al., "Novel Ultra High Density Memory with a Stacked-Surrounding Gate Transistor (S-SGT) Structured Cell," IEDM Proc. (2001) 33-36.

(Continued)

*Primary Examiner* — Yasser A Abdelaziez
(74) *Attorney, Agent, or Firm* — The Marbury Law Group PLLC

(57) ABSTRACT

A first tier structure is provided by forming first memory openings through a first alternating stack of first insulating layers and first spacer layers, and by forming sacrificial memory opening fill structures in the first memory openings. A second tier structure is formed over the first tier structure by forming a second alternating stack of second insulating layers and second spacer layers. Second memory openings are formed through the second tier structure in areas of the sacrificial memory opening fill structures. Distortion of the first tier structure and misalignment between the first and second memory openings is reduced or prevented by conducting thermal cycles at a lower temperature for the second tier structure than for the first tier structure.

10 Claims, 19 Drawing Sheets

(51) Int. Cl.
*H01L 23/522* (2006.01)
*H01L 23/528* (2006.01)
*H01L 23/532* (2006.01)

(52) U.S. Cl.
CPC .. *H01L 27/11524* (2013.01); *H01L 27/11556* (2013.01); *H01L 27/11582* (2013.01)

(58) Field of Classification Search
CPC ......... H01L 27/11551; H01L 27/11568; H01L 27/11578
See application file for complete search history.

(56) References Cited

U.S. PATENT DOCUMENTS

| | | | |
|---|---|---|---|
| 8,946,023 B2 | 2/2015 | Makala et al. | |
| 9,230,987 B2 | 1/2016 | Pachamuthu et al. | |
| 9,502,471 B1 | 11/2016 | Lu et al. | |
| 9,570,463 B1 | 2/2017 | Zhang et al. | |
| 9,627,403 B2 | 4/2017 | Liu et al. | |
| 2007/0241390 A1* | 10/2007 | Tanaka | H01L 27/115 257/314 |
| 2008/0277760 A1* | 11/2008 | Kohler | H01L 21/31116 257/532 |
| 2016/0204117 A1 | 7/2016 | Liu et al. | |
| 2017/0062454 A1 | 3/2017 | Lu et al. | |
| 2017/0200732 A1* | 7/2017 | Horiguchi | H01L 27/11582 |
| 2017/0229472 A1* | 8/2017 | Lu | H01L 27/11582 |

OTHER PUBLICATIONS

Handbook of Thin Film Deposition Processes and Techniques, (Second Edition) 2001, Principles, Methods, Equipment and Applications, Edited by:Krisna Seshan, ISBN: 978-0-8155-1442-8; Chapter 3, "Chemical vapor deposition of silicon dioxide films" by John Foggiato.

X. Zhang et al., "Residual Stress and Fracture of Thick Dielectric Films for Power MEMS Applications," *Proceeding of the 15th IEEE International Conference on Micro Electro Mechanical Systems (MEMS '02)*, Las Vegas, NV, USA, Jan. 20-24, 2002, pp. 164-167.

U.S. Appl. No. 15/015,190, filed Feb. 4, 2016, SanDisk Technologies LLC.

U.S. Appl. No. 15/186,768, filed Jun. 20, 2016, SanDisk Technologies LLC.

U.S. Appl. No. 15/243,260, filed Aug. 22, 2016, SanDisk Technologies LLC.

* cited by examiner

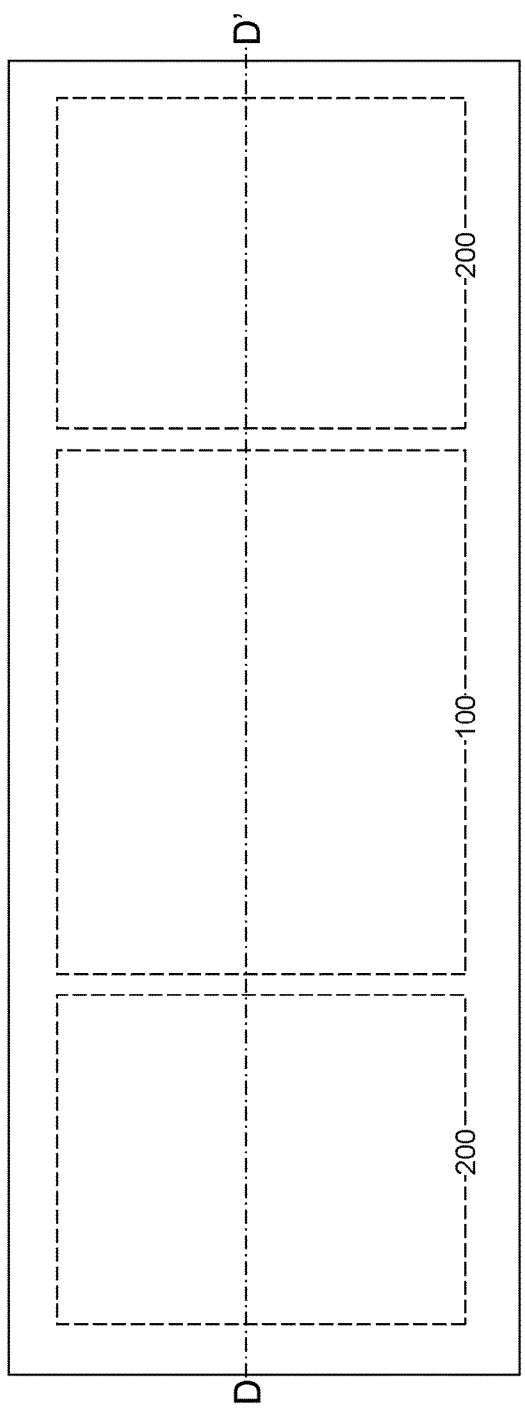
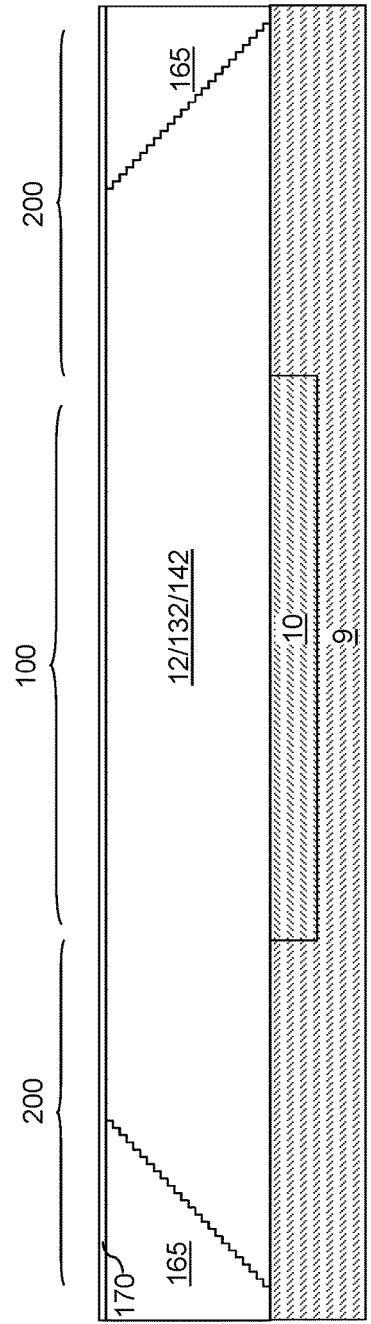
FIG. 2C
FIG. 2D

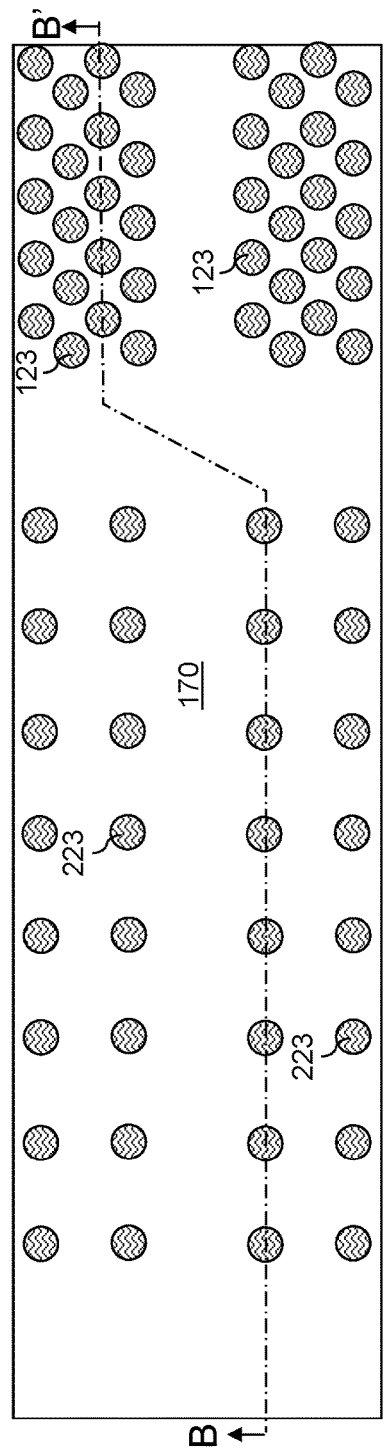
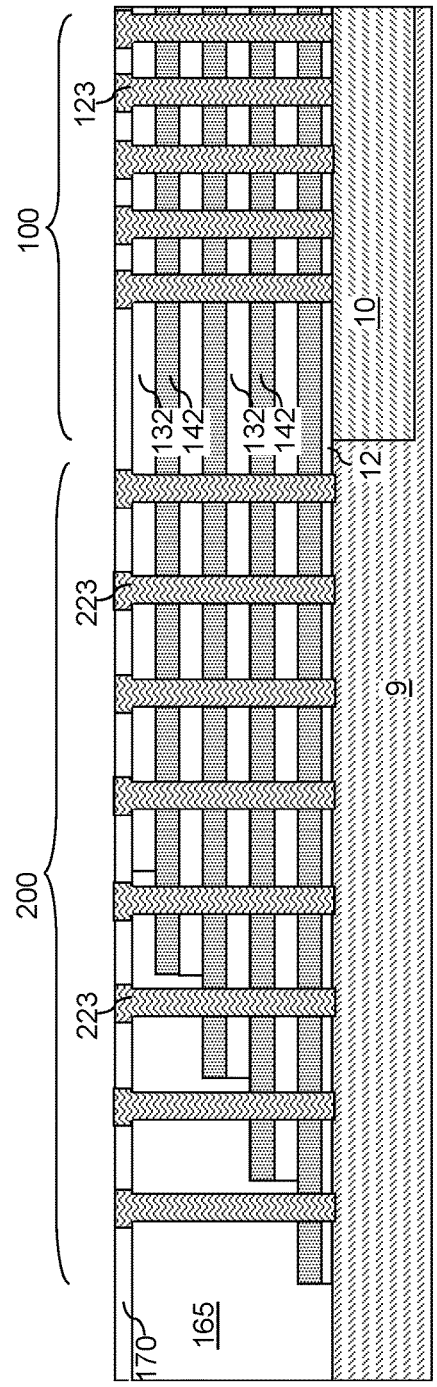
FIG. 4A
FIG. 4B

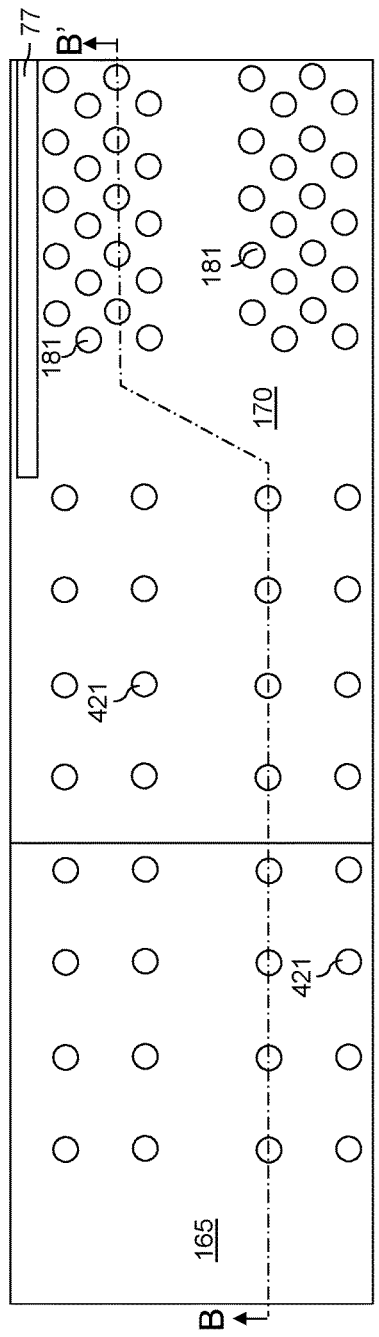
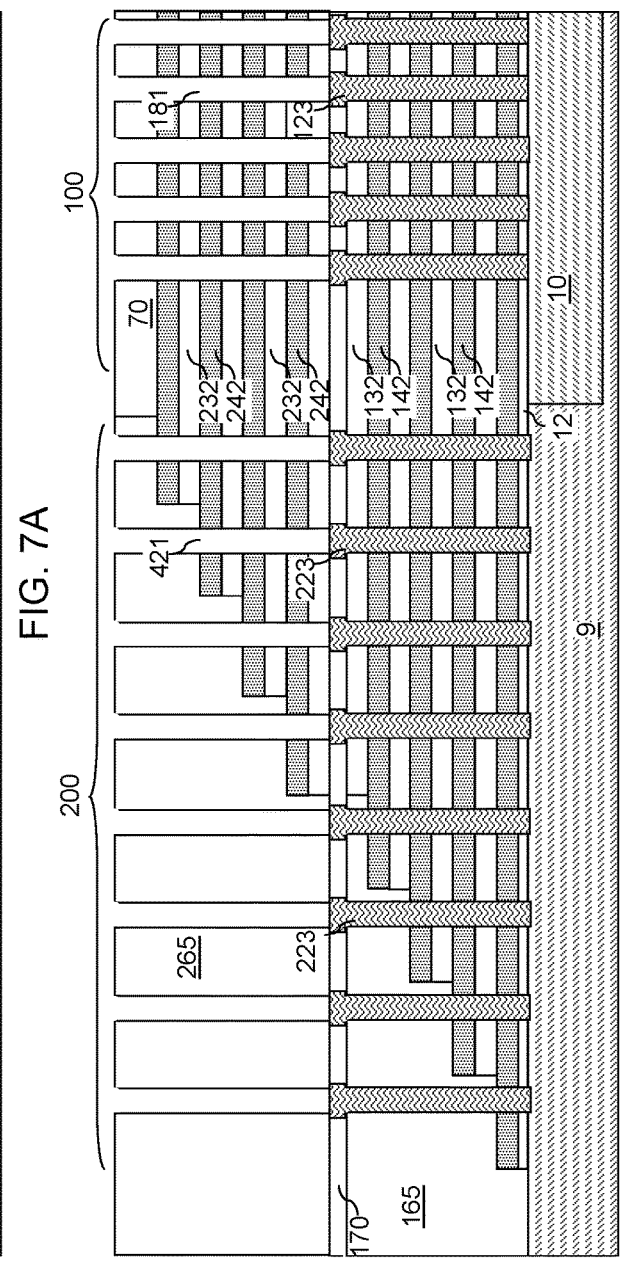
FIG. 7A
FIG. 7B

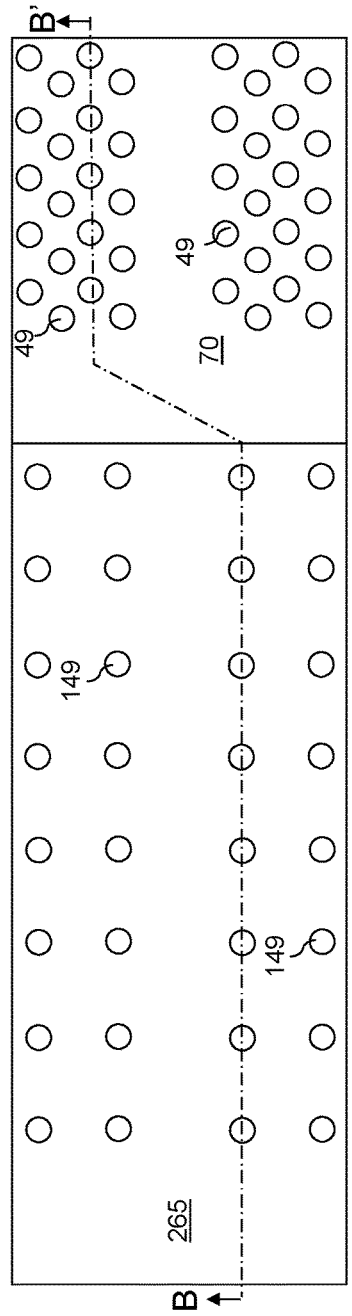
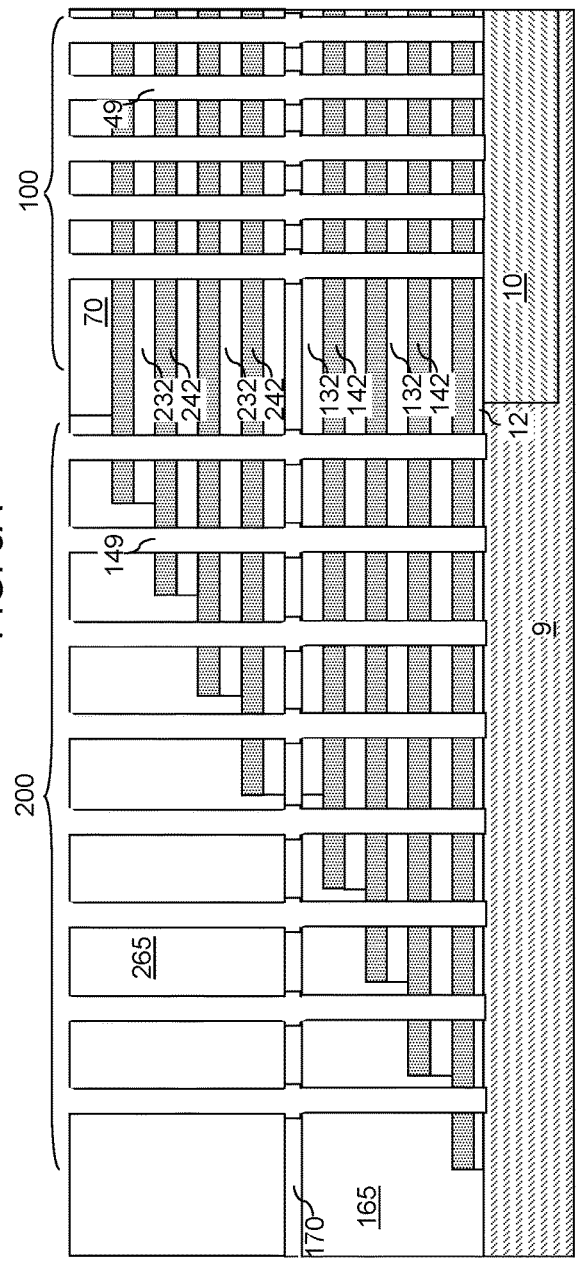
FIG. 8A
FIG. 8B

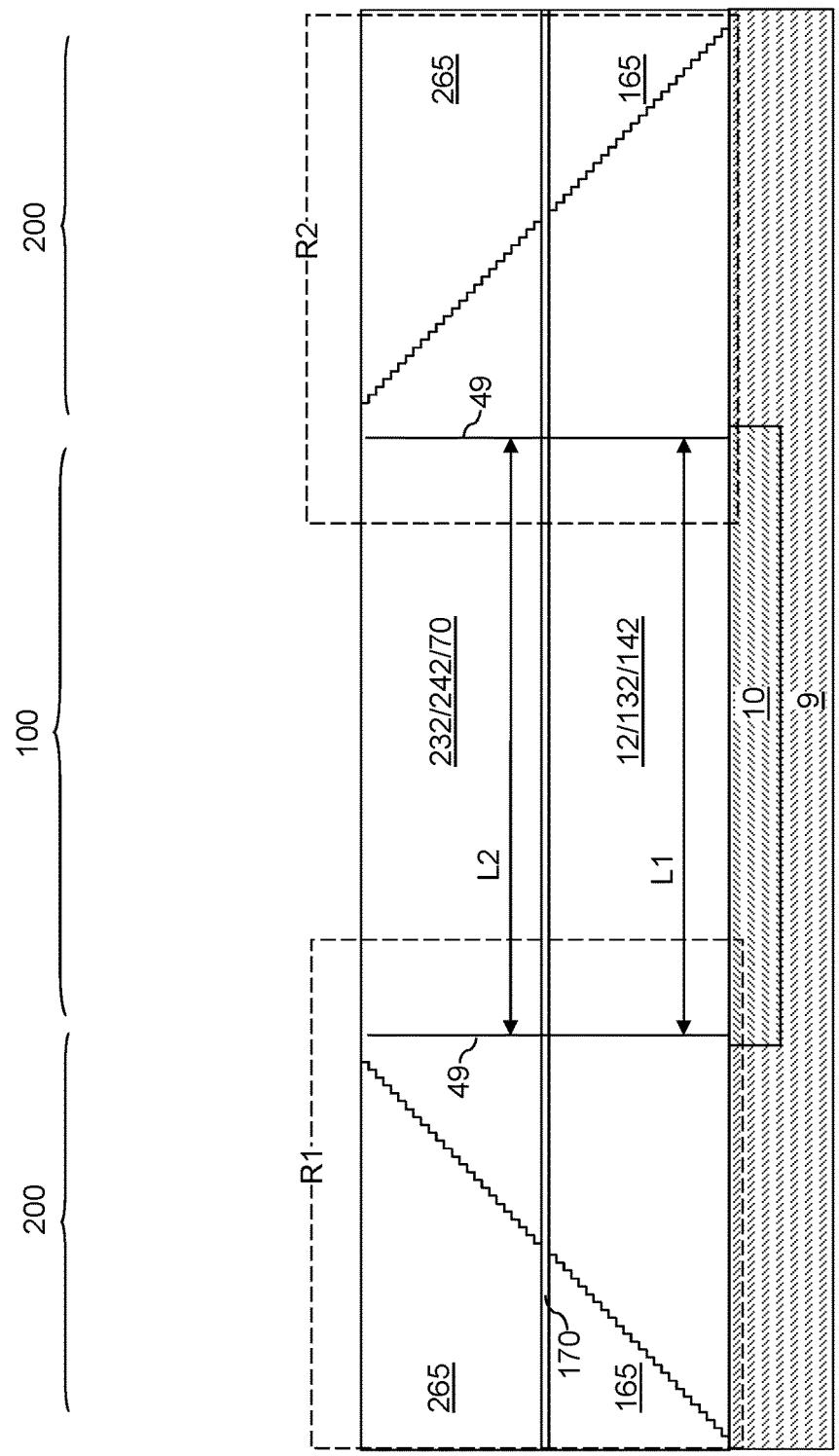

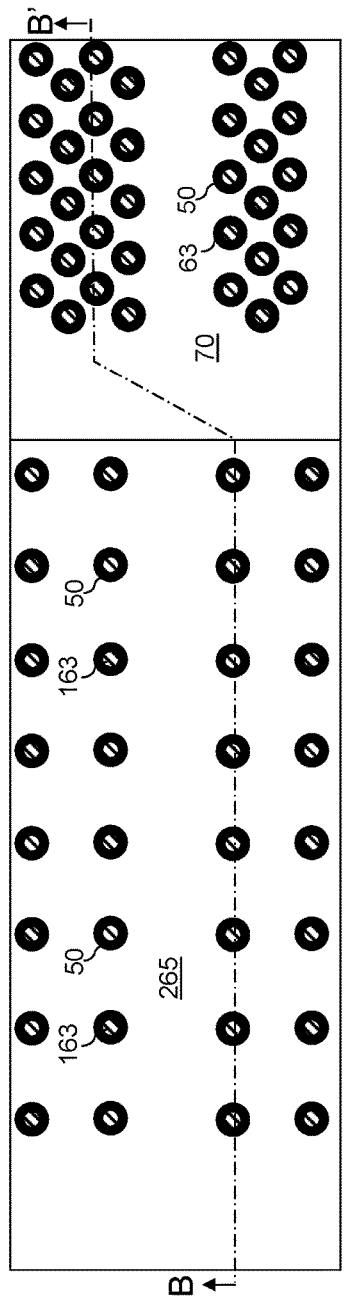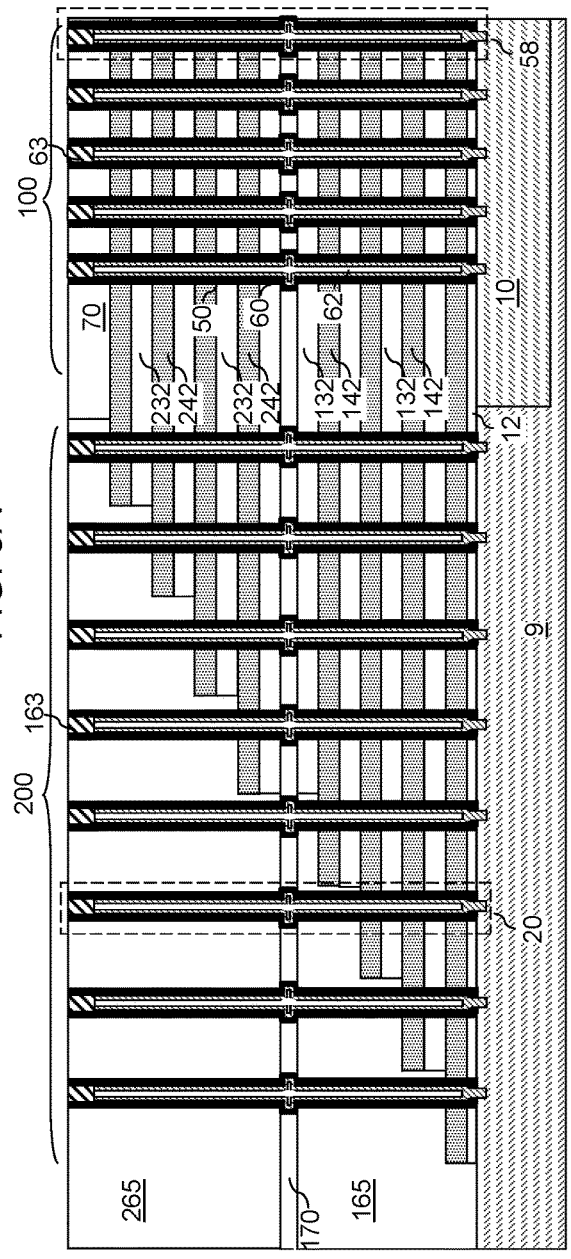
FIG. 9A
FIG. 9B

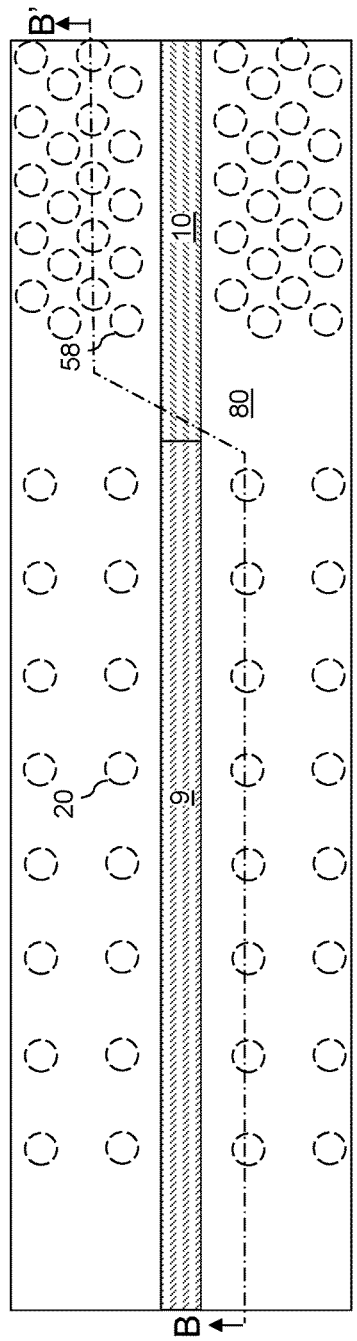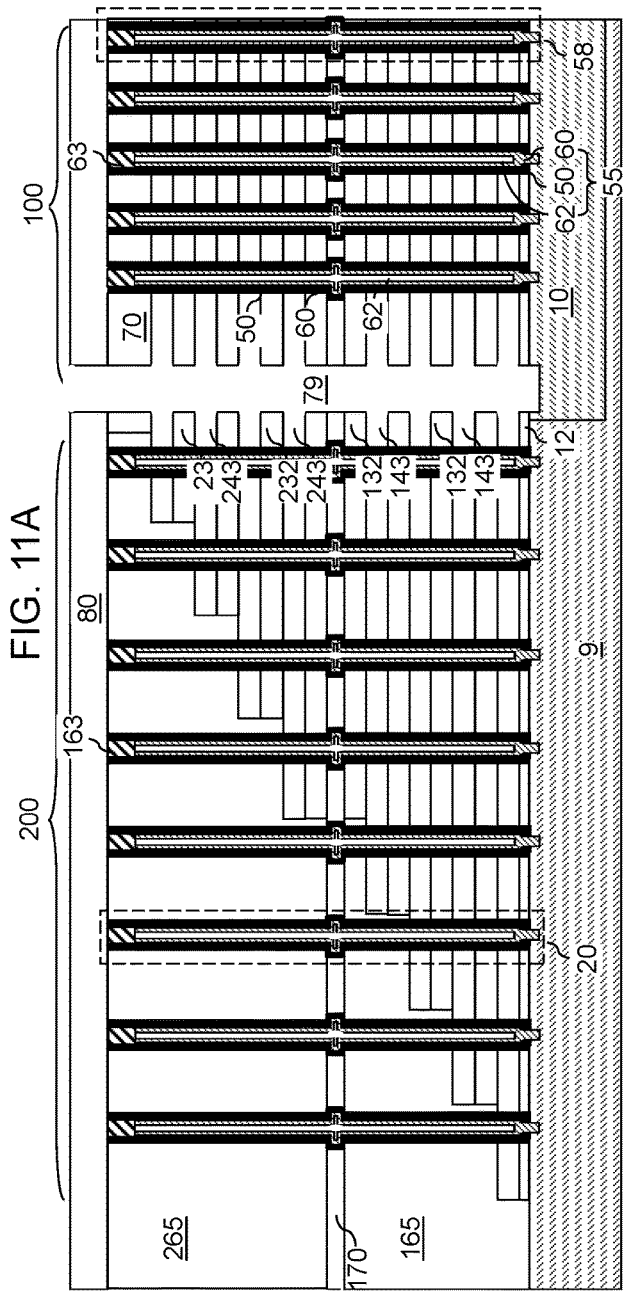
FIG. 11A
FIG. 11B

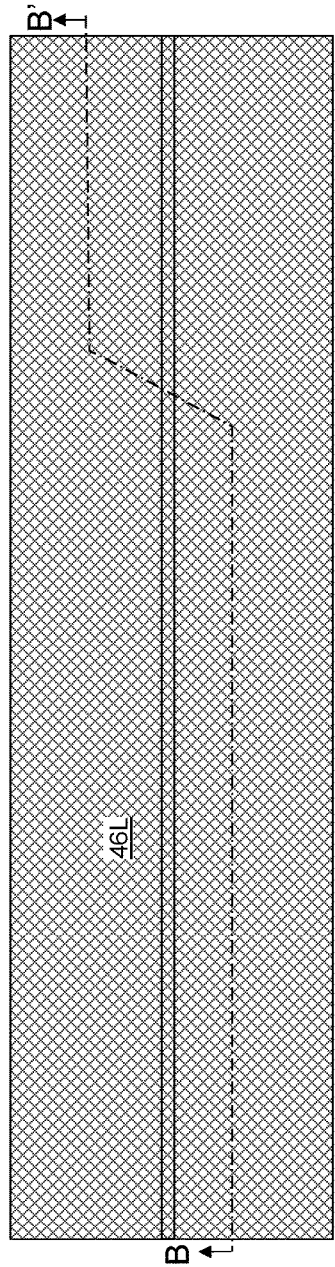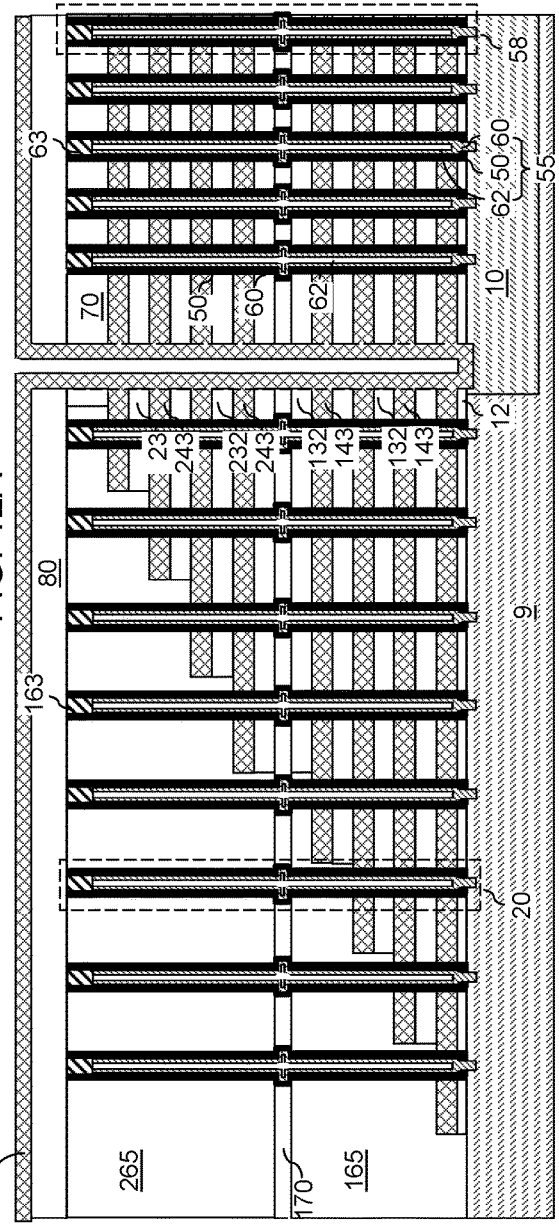
FIG. 12A
FIG. 12B

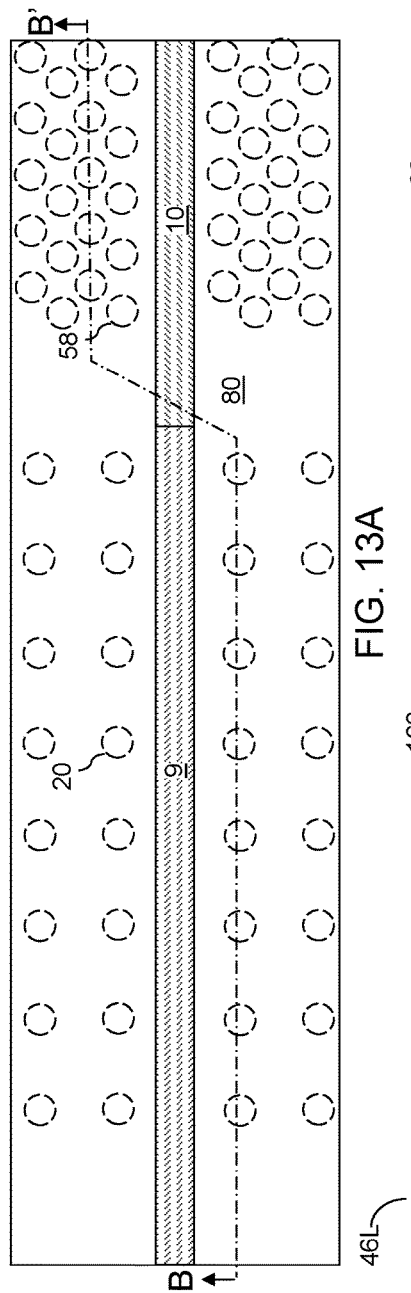
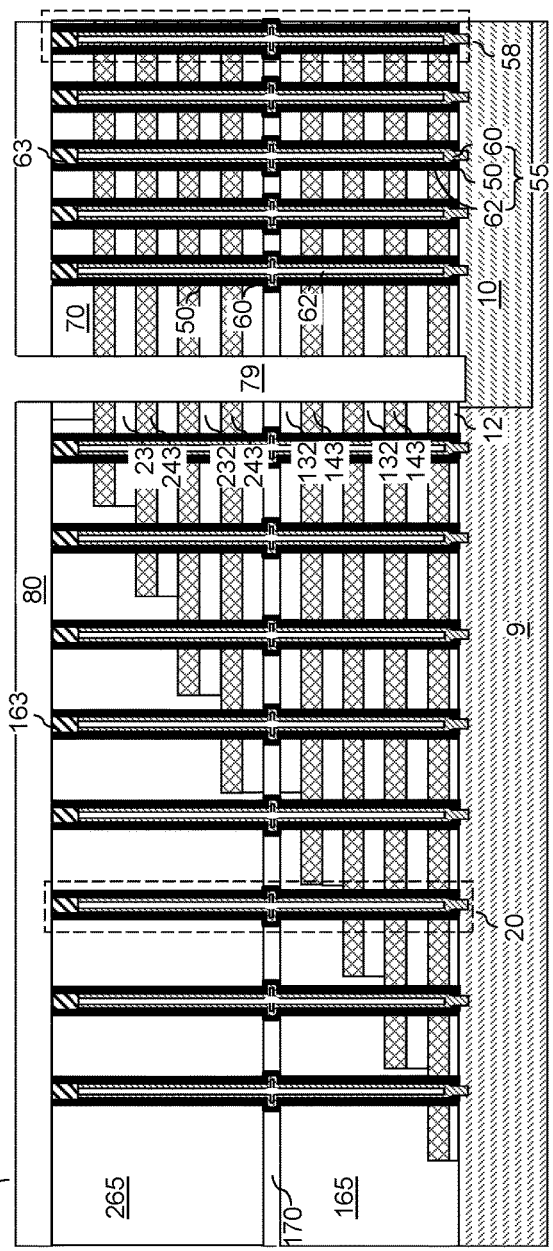
FIG. 13A
FIG. 13B

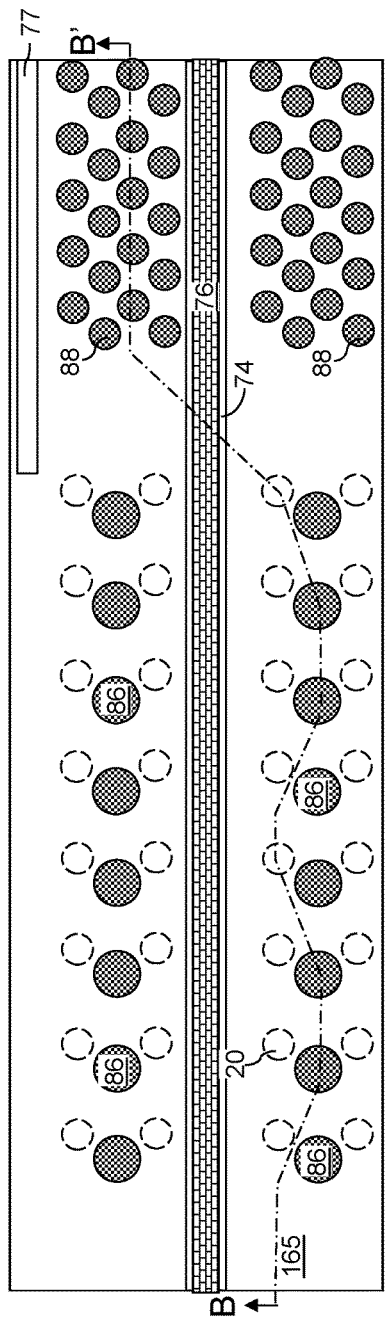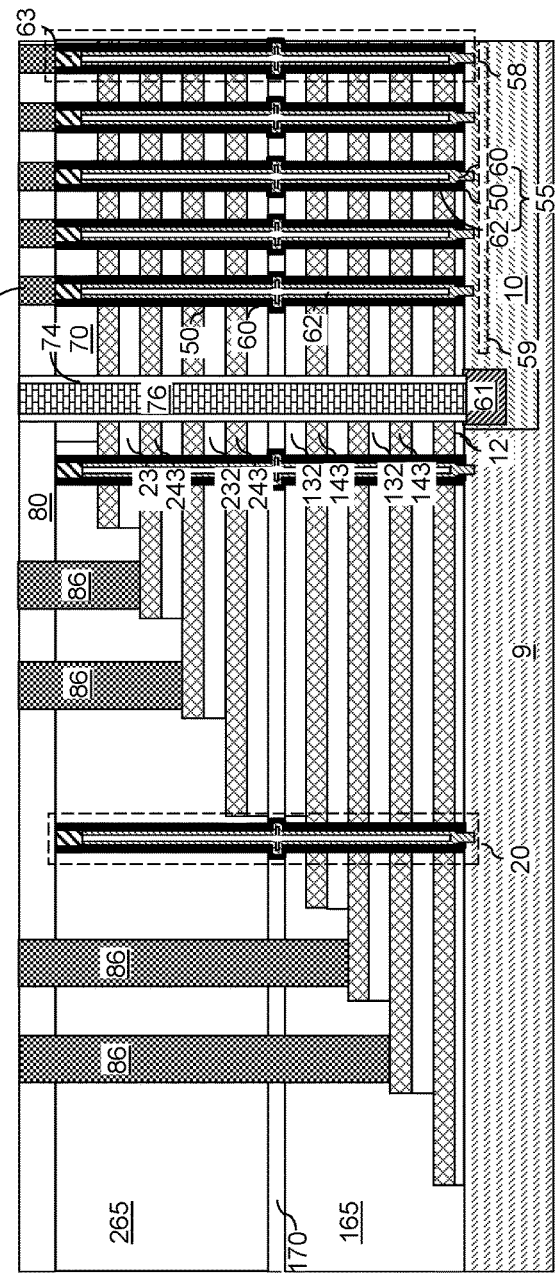
FIG. 15A
FIG. 15B

DISTORTION REDUCTION OF MEMORY OPENINGS IN A MULTI-TIER MEMORY DEVICE THROUGH THERMAL CYCLE CONTROL

FIELD

The present disclosure relates generally to the field of three-dimensional memory devices and specifically to three-dimensional memory devices employing multi-tier memory stack structures and methods of making the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a monolithic three-dimensional memory device is provided, which comprises: a first tier structure comprising a first alternating stack of first insulating layers and first electrically conductive layers located over a substrate; a second tier structure comprising a second alternating stack of second insulating layers and second electrically conductive layers located over the first tier structure; and a plurality of memory stack structures extending through the first tier structure and the second tier structure. The first insulating layers comprise a first silicon oxide material including hydrogen atoms at a first atomic concentration. The second insulating layers comprise a second silicon oxide material including hydrogen atoms at a second atomic concentration that is at least 1 atomic percent greater than the first atomic concentration.

According to another aspect of the present disclosure, a method of forming a three-dimensional memory device comprises forming a first tier structure comprising a first alternating stack of first insulating layers and first spacer layers over a substrate, forming first memory openings through the first alternating stack, forming sacrificial memory opening fill structures in the first memory openings, forming a second alternating stack of second insulating layers and second spacer layers over the memory opening fill structures in the first tier structure, forming second memory openings through the second alternating stack to expose the sacrificial memory opening fill structures, forming inter-tier memory openings by removing the sacrificial memory opening fill structures through the second memory openings; and forming a plurality of memory stack structures extending through the first tier structure and the second tier structure. In one embodiment, a highest temperature of each thermal cycle during formation of the second tier structure is lower than a highest temperature of each thermal cycle during formation of the first tier structure. In another embodiment, a highest temperature between the steps of forming the first alternating stack and the forming the sacrificial memory opening fill structures is at least 800 degrees Celsius, and a highest temperature between the steps of forming the second alternating stack and forming the inter-tier memory openings is below 800 degrees Celsius.

BRIEF DESCRIPTION OF THE DRAWINGS

FIG. 2C is a schematic top-down view of the exemplary structure at the processing step of FIGS. 2A and 2B.

FIG. 2D is a schematic vertical cross-sectional view along the vertical plane D-D' of the exemplary structure of FIG. 2C.

FIG. 4A is a schematic top-down view of a region of the exemplary structure after formation of sacrificial memory opening fill structures and sacrificial support opening fill structures according to an embodiment of the present disclosure.

FIG. 4B is a schematic vertical cross-sectional view along the vertical plane B-B' of the region of the exemplary structure of FIG. 4A.

FIG. 7A is a schematic top-down view of a region of the exemplary structure after formation of second memory openings and second support openings according to an embodiment of the present disclosure.

FIG. 7B is a schematic vertical cross-sectional view along the vertical plane B-B' of the region of the exemplary structure of FIG. 7A.

FIG. 8A is a schematic top-down view of a first region of the exemplary structure after formation of inter-tier memory openings and inter-tier support openings according to an embodiment of the present disclosure.

FIG. 8B is a schematic vertical cross-sectional view along the vertical plane B-B' of the first region of the exemplary structure of FIG. 8A.

FIG. 8C is a schematic top-down view of the exemplary structure at the processing step of FIGS. 8A and 8B.

FIG. 9A is a schematic top-down view of a region of the exemplary structure after formation of memory stack structures, second support pillar structures, drain regions, and dummy drain regions according to an embodiment of the present disclosure.

FIG. 9B is a schematic vertical cross-sectional view of the region of the exemplary structure of FIG. 9A along the vertical plane B-B'.

FIG. 11A is a schematic top-down view of a region of the exemplary structure after formation of backside recesses according to an embodiment of the present disclosure.

FIG. 11B is a schematic vertical cross-sectional view along the vertical plane B-B' of the region of the exemplary structure of FIG. 11A.

FIG. 12A is a schematic top-down view of a region of the exemplary structure after formation of first and second electrically conductive layers and a continuous conductive material layer according to an embodiment of the present disclosure.

FIG. 12B is a vertical cross-sectional view along the vertical cross-sectional plane B-B' of the exemplary structure of FIG. 12A.

FIG. 13A is a schematic top-down view of a region of the exemplary structure after removal of the continuous conductive material layer according to an embodiment of the present disclosure.

FIG. 13B is a schematic vertical cross-sectional view along the vertical plane B-B' of the region of the exemplary structure of FIG. 13A.

FIG. 15A is a schematic top-down view of a region of the exemplary structure after formation of additional contact via structures according to an embodiment of the present disclosure.

FIG. 15B is a schematic vertical cross-sectional view along the plane B-B' of the region of the exemplary structure of FIG. 15A.

DETAILED DESCRIPTION

Figure 1:
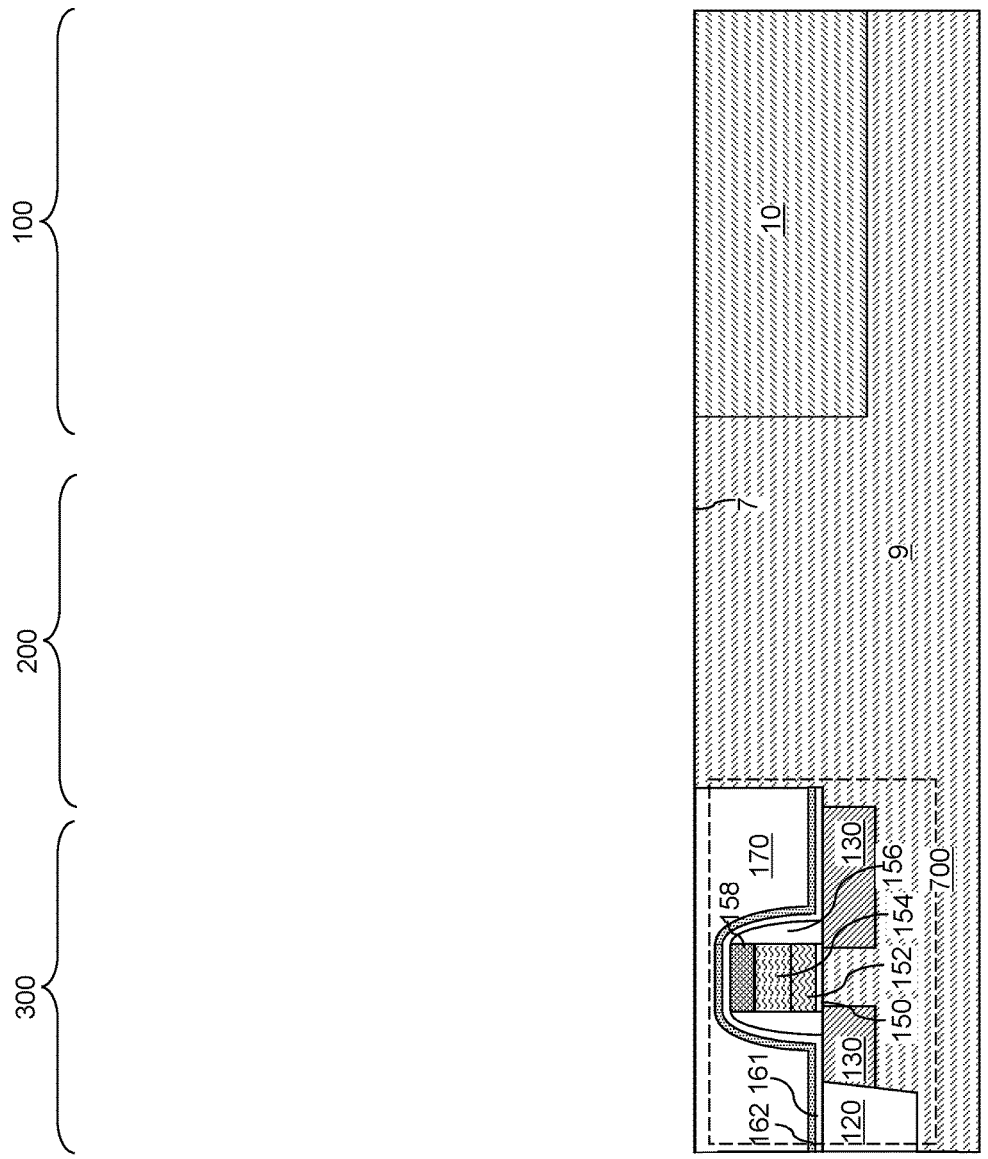
FIG. 1 is a schematic vertical cross-sectional view of an exemplary structure after formation of at least one peripheral device according to an embodiment of the present disclosure.
Figure 2A:
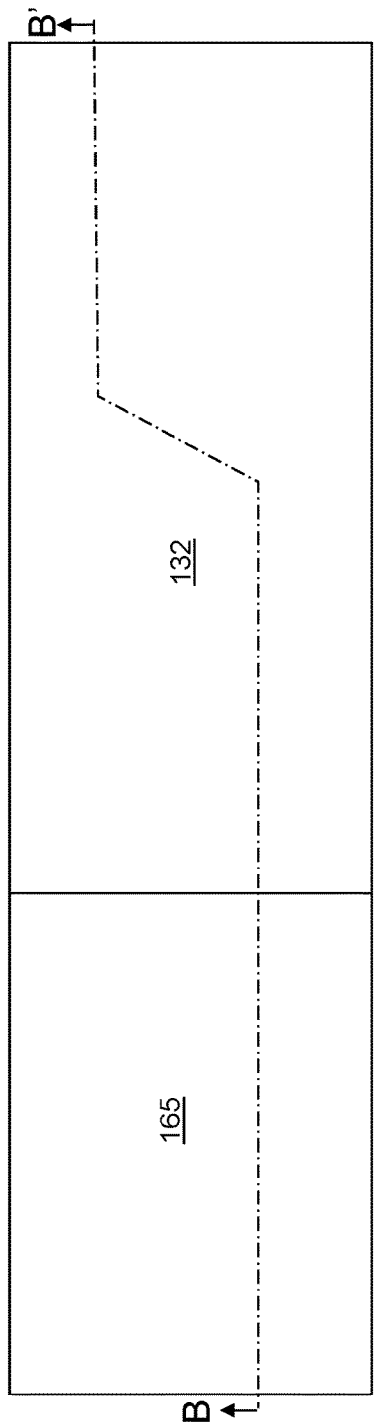
FIG. 2A is a schematic top-down view of a region the exemplary structure after formation of a first alternating stack of first insulating layers and first sacrificial material layers and a first retro-stepped dielectric material portion according to an embodiment of the present disclosure.
Figure 2B:
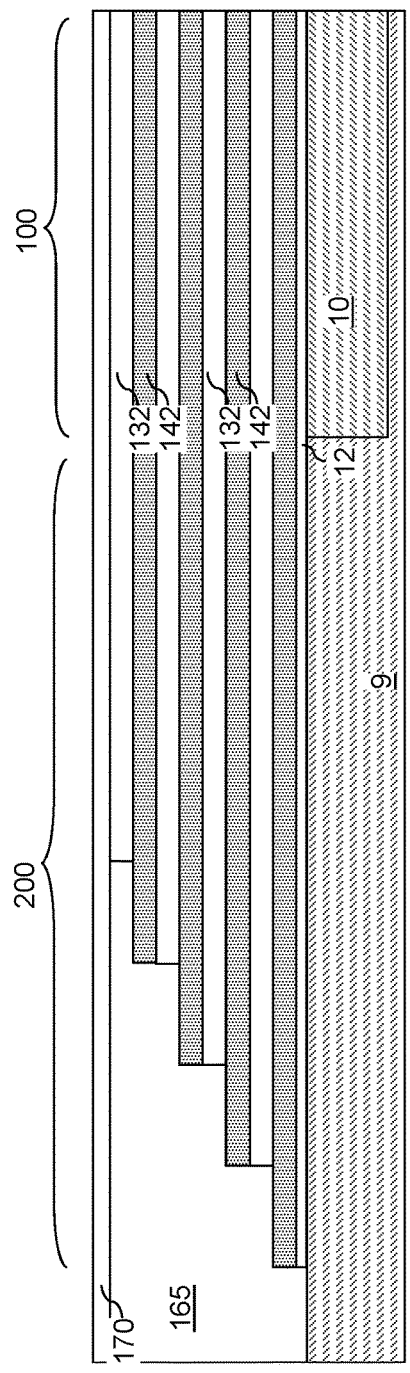
FIG. 2B is a schematic vertical cross-sectional view along the vertical plane B-B' of the region of the exemplary structure of FIG. 2A.

Multi-tier memory devices, such as three-dimensional NAND memory devices, are memory devices that employ multiple tier structures. Each tier structure is patterned to form a respective set of openings for forming memory elements therein at separate processing steps. Memory openings formed in different tier structures should be aligned to permit formation of common semiconductor channels that extend through the respective memory openings. The present inventors realized that high temperature thermal cycles used in the formation of the upper tier structures may result in shrinkage of the lower tier structure, resulting in a positional mismatch of the upper and lower portions of each memory opening. This mismatch may lead to damage of the memory film at the joint between the tier structures and failure to remove the memory film at the bottom of the memory opening to expose a horizontal channel of the memory device.

The present inventors realized that the positional mismatch of the upper and lower portions of each memory opening can be reduced or eliminated if the highest temperature of each thermal cycle during forming the upper tier structure is lower than the highest temperature of each thermal cycle during forming the lower tier structure. As discussed above, the present disclosure is directed to three-dimensional memory devices including a vertical stack of multilevel memory arrays and methods of making the same, the various aspects of which are described below. An embodiment of the disclosure can be employed to form semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. A layer may extend horizontally, vertically, and/or along a tapered surface. A substrate may be a layer, may include one or more layers therein, and/or may have one or more layer thereupon, thereabove, and/or therebelow.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two-dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays. The various three-dimensional memory devices of the present disclosure include a monolithic three-dimensional NAND string memory device, and can be fabricated employing the various embodiments described herein.

Referring to FIG. 1, an exemplary structure according to an embodiment of the present disclosure is illustrated, which can be employed, for example, to fabricate a device structure containing vertical NAND memory devices. The exemplary structure includes a substrate, which can be a semiconductor substrate (9, 10). The substrate can include a substrate semiconductor layer 9. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a balance band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. Optionally, a portion of the substrate semiconductor layer 9 can be vertically recessed to provide a recessed region, and the at least one semiconductor device 700 may be formed in the recessed region. Alternatively, an additional semiconductor material may be added to the substrate semiconductor layer 9 outside a region of the at least one semiconductor device 700, for example, by selective epitaxy after formation of the at least one semiconductor device.

The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, a gate electrode (152, 154), and a gate cap dielectric 158. The gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a dielectric liner. Active regions 130 can be formed in upper portions of the substrate semiconductor layer 9, for example, by introducing electrical dopants employing the at least one gate structure (150, 152, 154, 158) as masking structures. Additional masks may be employed as needed.

The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9.

An optional semiconductor material layer 10 may be formed within, or on top of, the substrate semiconductor layer 9 by ion implantation of electrical dopants (such as p-type dopants or n-type dopants) and/or by deposition of a single crystalline semiconductor material, for example, by selective epitaxy. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 170.

The region (i.e., area) of the at least one semiconductor device 700 is herein referred to as a peripheral device region 300. The region in which a memory array is subsequently formed is herein referred to as a memory array region 100. A contact region 200 for subsequently forming stepped terraces of electrically conductive layers can be provided between the memory array region 100 and the peripheral device region 300.

Referring to FIGS. 2A-2D, a gate dielectric layer 12 can be optionally formed above the semiconductor material layer 10 and the planarization dielectric layer 170. The gate dielectric layer 12 can include, for example, a silicon oxide layer and/or a dielectric metal oxide layer (such as an aluminum oxide layer and/or a hafnium oxide layer). The thickness of the gate dielectric layer 12 can be in a range from 3 nm to 30 nm, although lesser and greater thicknesses can also be employed.

An alternating stack of first material layers and second material layers is subsequently formed. Each first material layer can include a first material, and each second material layer can include a second material that is different from the first material. The first material layers can be first insulating layers 132, and the second material layers can be first spacer layers that provide vertical spacing between each vertically neighboring pair of the first insulating layers 132. In one embodiment, the first material layers and the second material layers can be first insulating layers 132 and first sacrificial material layers 142, respectively. In one embodiment, each first insulating layer 132 can include a first insulating material, and each first sacrificial material layer 142 can include a first sacrificial material. The alternating stack formed by the first insulating layers 132 and the first sacrificial material layers 142 is herein referred to as a first alternating stack (132, 142), or a lower alternating stack (132, 142). In this case, the stack can include an alternating plurality of first insulating layers 132 and first sacrificial material layers 142. As used herein, a "sacrificial material" refers to a material that is removed during a subsequent processing step. Alternatively, the first spacer layers can be formed as first electrically conductive layers. In this case, the processing steps that are subsequently employed to replace the first spacer material layers with first electrically conductive layers can be omitted.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first alternating stack (132, 142) can include first insulating layers 132 composed of the first material, and first sacrificial material layers 142 composed of the second material, which is different from the first material. In one embodiment, the first material of the first insulating layers 132 can be a hydrogen-containing silicon oxide material. A hydrogen-containing silicon oxide material is a silicon oxide material that includes hydrogen atoms above a trace level, such as at an atomic concentration greater than 10 parts per million. In one embodiment, the hydrogen-containing silicon oxide material of the first insulating layers 132 can be deposited by thermal decomposition (e.g., by low pressure chemical vapor deposition (LPCVD) or atmospheric pressure chemical vapor deposition (APCVD)) or plasma decomposition (e.g., by plasma enhanced chemical vapor deposition (PECVD)) of a hydrogen-containing precursor material that can be decomposed, or reacted, into a silicon oxide material. Alternatively, the hydrogen-containing silicon oxide material of the first insulating layers 132 can be deposited by thermal decomposition or plasma decomposition of a precursor material in the presence of a hydrogen carrier gas. For example, the hydrogen-containing silicon oxide material of the first insulating layers 132 can be deposited by thermal decomposition or plasma decomposition of tetraethylorthosilicate (TEOS) or other organic or inorganic hydrogen-containing precursors for silicon oxide deposition.

A thermal chemical vapor deposition process, a plasma-assisted chemical vapor deposition process, or an atomic layer deposition process can be employed to deposit the hydrogen-containing silicon oxide material of the insulating layers 132. Typically, the atomic concentration of hydrogen atoms deposited by a thermal chemical vapor deposition process can be in a range from 2% to 15% depending on the precursor gas and the deposition pressure, and the atomic concentration of hydrogen atoms deposited by plasma-assisted chemical vapor deposition process can be in a range from 2% to 6% depending on the precursor gas and the plasma conditions. The hydrogen-containing silicon oxide material of the first insulating layers 132 can be doped with additional intentional or unintentional dopants such as boron, phosphorus, fluorine, and/or carbon. In one embodiment, the first insulating layers 132 include a hydrogen-containing silicon oxide material including hydrogen at an atomic concentration within a range from 2% to 15%, such as from 3.0% to 12.0%.

Generally, the hydrogen-containing silicon oxide material of the first insulating layers 132 can have a wide range of atomic hydrogen concentration depending on deposition conditions. Such variability of hydrogen concentration is known in the art. For example, Chapter 3 of Handbook of Thin Film Deposition Processes and Techniques by Krisna Seshan (ISBN: 978-0-8155-1442-8), pp. 111-150 (2001) discusses the hydrogen contents in silicon oxide films. In case a carbon-containing precursor gas (such as TEOS) is employed to deposit the hydrogen-containing silicon oxide material, the deposited hydrogen-containing silicon oxide material of the first insulating layers 132 can include carbon atoms at an atomic concentration greater than 10 parts per million (which may be in a range from 30 parts per million to 300 parts per million).

The second material of the first sacrificial material layers 142 can be a sacrificial material that can be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the first sacrificial material layers 142 can be material layers that comprise silicon nitride or a semiconductor material including at least one of silicon and germanium.

In one embodiment, the first insulating layers 132 can include a first hydrogen-containing silicon oxide, and sacrificial material layers can include silicon nitride sacrificial material layers. The first material of the first insulating layers 132 can be deposited, for example, by plasma enhanced chemical vapor deposition (PECVD) or atmospheric pressure chemical vapor deposition (APCVD). For example, tetraethylorthosilicate (TEOS) can be employed as the precursor material for the CVD process for depositing the hydrogen-containing silicon oxide material of the first insulating layers 132.

Because of the high hydrogen content in the hydrogen-containing silicon oxide material of the first insulating layers 132, the etch rate of the hydrogen-containing silicon oxide material can be significantly higher than the etch rate of thermal silicon oxide (i.e., silicon oxide formed by thermal oxidation of silicon) or densified silicon oxides that are deposited by CVD at a relatively low temperature (e.g., below 600 C) and annealed at a relatively high temperature (e.g., at 800 C and above) to reduce the hydrogen content. For example, the etch rate of the hydrogen-containing silicon oxide material of the first insulating layers 132 in a 100:1 diluted hydrofluoric acid can be greater than the etch rate of thermal oxide in a 100:1 diluted hydrofluoric acid at least by a factor of 2, and/or by a factor greater than 3. It is understood that all etch rate measurements are at room temperature (20 degrees Celsius ("C")) unless otherwise specified.

The second material of the first sacrificial material layers 142 can be formed, for example, CVD or atomic layer deposition (ALD).

The thicknesses of the first insulating layers 132 and the first sacrificial material layers 142 can be in a range from 20 nm to 50 nm, although lesser and greater thicknesses can be employed for each first insulating layer 132 and for each first sacrificial material layer 142. The number of repetitions of the pairs of a first insulating layer 132 and a first sacrificial material layer 142 can be in a range from 2 to 1,024, and typically from 8 to 256, although a greater number of repetitions can also be employed. In one embodiment, each first sacrificial material layer 142 in the first alternating stack (132, 142) can have a uniform thickness that is substantially invariant within each respective first sacrificial material layer 142.

The first tier structure (132, 142) can be patterned to form first stepped surfaces. The first stepped surfaces form a first terrace region, which is located within an area of the contact region 200. The contact region 200 includes the first terrace region in which the first stepped surfaces are formed, and a second terrace region in which additional stepped surfaces are to be subsequently formed in an second tier structure (to be subsequently formed over the first tier structure). The memory array region 100 is provided adjacent to the contact region 200. Memory devices including memory stack structures can be subsequently formed in the memory array region 100.

Underlying layers within the first alternating stack (132, 142) laterally extend farther than overlying layers within the first alternating stack (132, 142) in the first terrace region. The first stepped surfaces can be formed, for example, by forming a mask layer with an opening therein, etching a cavity within the levels of the topmost first sacrificial material layer 142 and the topmost first insulating layer 132, and iteratively expanding the etched area and vertically recessing the cavity by etching each pair of a first insulating layer 132 and a first sacrificial material layer 142 located directly underneath the bottom surface of the etched cavity within the etched area. The first alternating stack (132, 142) is patterned such that each underlying first sacrificial material layer 142 laterally protrudes farther than any overlying first sacrificial material layer 142 in the etched region, and each underlying first insulating layer 132 laterally protrudes farther than overlying first insulating layers 132 in the etched region. A stepped cavity is formed within each contact region 200. Each stepped cavity that is formed at this step is herein referred to as a first stepped cavity.

A dielectric material is deposited to fill the first stepped cavities. Excess portions of the dielectric material overlying the topmost surface of the first alternating stack (132, 142), are removed for example, by chemical mechanical planarization. Each remaining portion of the deposited dielectric material forms a first dielectric material portion, which is herein referred to as a first retro-stepped dielectric material portion 165. The first retro-stepped dielectric material portions 165 are formed on the first stepped surfaces of the first terrace regions. The first dielectric material portions 165 are retro-stepped. As used herein, a "retro-stepped" element refers to an element that has stepped surfaces and a horizontal cross-sectional area that increases monotonically as a function of a vertical distance from a top surface of a substrate on which the element is present. The first tier structure, which is also referred to as a first stack structure, comprises the first alternating stack (132, 142) and the first retro-stepped dielectric material portions 165. The first retro-stepped dielectric material portion 165 is incorporated into the first tier structure (12, 132, 142, 165). An optional anneal at a temperature above 750 C (i.e., degrees Celsius), such as at a temperature of 800 C and above, may be performed at this time, as will be described in more detail below.

In one embodiment, the first retro-stepped dielectric material portions 165 can be formed by depositing a first silicon oxide fill material over the first terrace regions. In one embodiment, the first silicon oxide fill material can include a hydrogen-containing silicon oxide material. A thermal chemical vapor deposition process (e.g., LPCVD or APCVD), a plasma-assisted chemical vapor deposition process (e.g., PECVD), or an atomic layer deposition process can be employed to deposit the hydrogen-containing silicon oxide material of the first retro-stepped dielectric material portions 165. Preferably, a TEOS source is used to deposit the first retro-stepped dielectric material portions 165. The deposition temperature of the first silicon oxide fill material can be less than 650 degrees Celsius, and may be less than 550 degrees Celsius, such as 250 to 500, for example 300 to 450 degrees Celsius. The hydrogen-containing silicon oxide material of the first retro-stepped dielectric material portions 165 can be doped with additional intentional or unintentional dopants such as boron, phosphorus, fluorine, and/or carbon. In one embodiment, the first retro-stepped dielectric material portions 165 include a hydrogen-containing silicon oxide material including hydrogen at an atomic concentration within a range from 2% to 15%, such as from 3.0% to 12.0%. The atomic concentration of hydrogen in the first retro-stepped dielectric material portions 165 may be the same as, or may be different from, the atomic concentration of hydrogen in the first insulating layers 132.

Because of the high hydrogen content in the hydrogen-containing silicon oxide material of the first retro-stepped dielectric material portions 165, the etch rate of the hydrogen-containing silicon oxide material in the first retro-stepped dielectric material portions 165 can be significantly higher than the etch rate of thermal silicon oxide or densified silicon oxides that are deposited by CVD and annealed at a high temperature to reduce the hydrogen content. For example, the etch rate of the hydrogen-containing silicon oxide material of the first retro-stepped dielectric material portions 165 in a 100:1 diluted hydrofluoric acid can be greater than the etch rate of thermal oxide in a 100:1 diluted hydrofluoric acid at least by a factor of 2, and/or by a factor greater than 3.

Optionally, an inter-tier insulating layer 170 can be formed over the first tier structure (12, 132, 142, 165). The inter-tier insulating layer 170 includes a material that is different from the material of the first sacrificial material layers 142. In one embodiment, the inter-tier insulating layer 170 can include silicon oxide or doped silicate glass such as borosilicate glass, phosphosilicate glass, or borosilicate glass. In one embodiment, the inter-tier insulating layer 170 can include a doped silicate glass that includes at least one of boron, phosphorus, and fluorine at an atomic concentration greater than 1.0%. In addition, the inter-tier insulating layer 170 can include hydrogen atoms at an atomic concentration in a range from 2% to 15%. In one embodiment, the atomic concentration of hydrogen in the inter-tier insulating layer 170 may be about the same as the atomic concentration of hydrogen in the first insulating layers 132. In one embodiment, the inter-tier insulating layer 170 can include hydrogen-containing doped silicate glass that has an etch rate that is greater than the etch rate of the hydrogen-containing silicon oxide of the first insulating layers 132 by a factor of at least two (such as from 2 to 100). The inter-tier insulating layer 170 can be deposited by chemical vapor deposition process, and can have a thickness in a range from 30 nm to 300 nm, although lesser and greater thicknesses can also be employed.

At least one anneal process can be performed prior to, and/or after, formation of the first retro-stepped dielectric material portions 165 to densify the hydrogen-containing silicon oxide materials of the first insulating layers 132 and the first retro-stepped dielectric material portions 165. The at least one anneal process can be performed in vacuum or in an inert ambient including nitrogen and/or argon at an elevated temperature at, or above, 750 degrees Celsius, such as at, or above, 800 degrees Celsius. For example, a first anneal process at a first elevated temperature in a range from 800 degrees Celsius to 1200 degrees Celsius can be performed after deposition of the first alternating stack (132, 142) for a duration in a range from 5 minutes to 120 minutes, a second anneal process at a second elevated temperature in a range from 800 degrees Celsius to 1200 degrees Celsius can be performed after formation of the first retro-stepped dielectric material portions 165 for a duration in a range from 5 minutes to 10 hours, and/or a third anneal process at a third elevated temperature in a range from 800 degrees Celsius to 1200 degrees Celsius can be performed after formation of the inter-tier insulating layer for a duration in a range from 5 minutes to 10 hours. Alternatively, a rapid thermal anneal (RTA) can be performed for 0.5 seconds to 60 seconds instead of the one or more longer duration furnace anneals described above. Any combination of one, two or all three of the first, second and/or third anneal processes can be performed.

Atomic concentration of hydrogen in the first insulating layers 142 and the first retro-stepped dielectric material portions 165 can be reduced by the at least one anneal process. In one embodiment, the atomic concentration of hydrogen in the first insulating layers 132 can decrease by more than 1.0% during the at least one anneal process, and the atomic concentration of hydrogen in the first retro-stepped dielectric material portions 165 can decrease by more than 1.0% during the at least one anneal process. In one embodiment, the atomic concentration of hydrogen in the first insulating layers 142 can be less than 3%, such as in a range from 0.1% to 2.0%, such as 0.1% to 0.5% and the atomic concentration of hydrogen in the first retro-stepped dielectric material portions 165 can be less than 3%, such as in a range from 0.1% to 2.0%, 0.1% to 0.5%.

The at least one anneal process induces contraction of the hydrogen-containing silicon oxide materials of the first insulating layers 132 and the first retro-stepped dielectric material portions 165. The at least one anneal process increases the magnitude of the stress that the first retro-stepped dielectric material portions 165 apply to the first alternating stack (132, 142). In one embodiment, the contraction of the hydrogen-containing silicon oxide materials can induce compressive stress applied by the first retro-stepped dielectric material portions 165 on the first alternating stack (132, 142).

Further, densification and reduction of the hydrogen content in the hydrogen-containing silicon oxide materials of the first insulating layers 132 and the first retro-stepped dielectric material portions 165 can induce reduction of the etch rate of the hydrogen-containing silicon oxide materials in dilute hydrofluoric acid. For example, the etch rate of the hydrogen-containing silicon oxide materials of the first insulating layers 132 and the first retro-stepped dielectric material portions 165 can decrease at least by 50% during the at least one anneal process. For example, the ratio of the etch rate of the hydrogen-containing silicon oxide material of the first insulating layers 132 in a 100:1 diluted hydrofluoric acid prior to the at least one anneal process to the etch rate of the hydrogen-containing silicon oxide material of the first insulating layers 132 in a 100:1 diluted hydrofluoric acid after the at least one anneal process can be in a range from 2 to 200, such as a range from 3 to 10.

The at least one anneal process induces volume changes in the first tier structure (12, 132, 142, 165) so that additional volume changes in subsequent thermal processing steps are minimized.

Figure 3A:
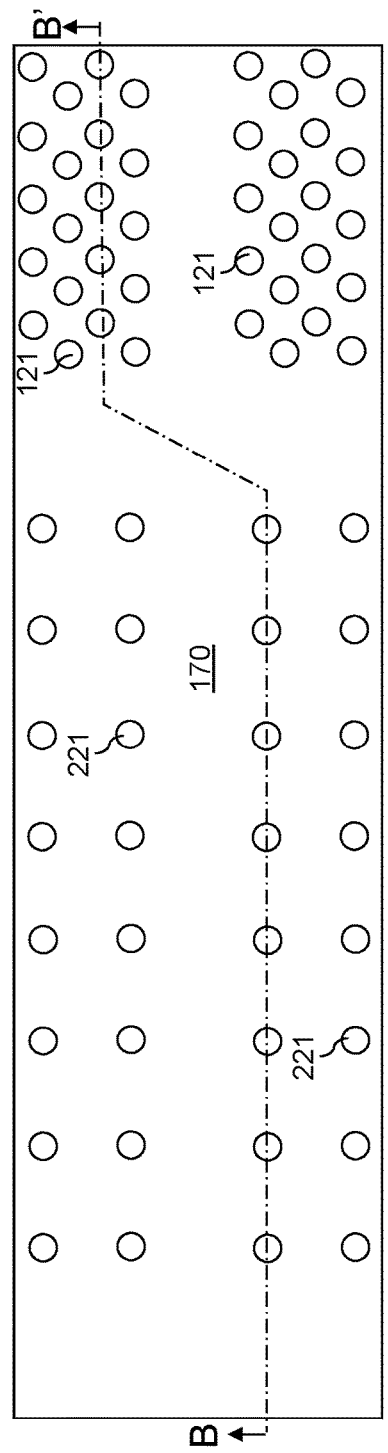
FIG. 3A is a schematic top-down view of a region of the exemplary structure after formation of first memory openings and first support openings according to an embodiment of the present disclosure.
Figure 3B:
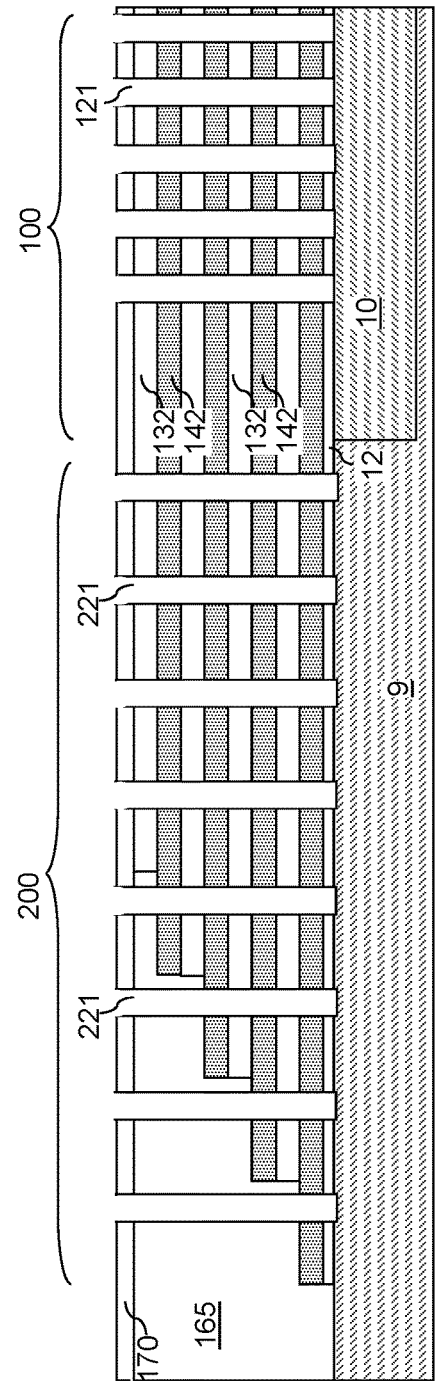
FIG. 3B is a schematic vertical cross-sectional view along the vertical plane B-B' of the region of the exemplary structure of FIG. 3A.

Referring to FIGS. 3A and 3B, first openings (121, 221) extending to a top surface of the substrate (9, 10) are formed through the first tier structure (12, 132, 142, 165). To form the first openings (121, 221), a lithographic material stack (not shown) including at least a photoresist layer can be formed over the first tier structure (12, 132, 142, 165), and can be lithographically patterned to form openings within the lithographic material stack. The pattern in the lithographic material stack can be transferred through the entirety of the first tier structure (12, 132, 142, 165) by at least one anisotropic etch that employs the patterned lithographic material stack as an etch mask. Portions of the first tier structure (12, 132, 142, 165) underlying the openings in the patterned lithographic material stack are etched to form the first openings (121, 221). In other words, transfer of the pattern in the patterned lithographic material stack through the first tier structure (12, 132, 142, 165) forms the first openings (121, 221).

The first openings (121, 221) include first memory openings 121 that are formed in the memory array region 100 and first support openings 221 that are formed in the contact region 200. A subset of the first support openings 221 can be formed through the first retro-stepped dielectric material portion 165 and the first stepped surfaces of the first alternating stack (132, 142). Another subset of the first support openings 221 can be formed through each layer in the first alternating stack (132, 142).

In one embodiment, the chemistry of the anisotropic etch process employed to etch through the materials of the first alternating stack (132, 142) can alternate to optimize etching of the first and second materials in the first alternating stack (132, 142) while providing a comparable average etch rate for the first retro-stepped dielectric material portion 165. The anisotropic etch can be, for example, a series of reactive ion etches. The sidewalls of the first openings (121, 221) can be substantially vertical, or can be tapered. Subsequently, the patterned lithographic material stack can be subsequently removed, for example, by ashing. The first memory openings 121 and the first support openings 221 can be formed concurrently employing the same set of anisotropic etch processes.

In one embodiment, the substrate (9, 10) can be employed as a stopping layer for the anisotropic etch process. In one embodiment, the first openings (121, 221) may extend below the top surface of the substrate (9, 10) by an overetch. The lateral dimensions (e.g., a diameter) of the first openings (121, 221) can be from about 20 nm to 200 nm at an upper portion of each first opening (121, 221), and can be about 10 nm to 150 nm at a lower portion of each first opening (121, 221). The sidewalls of the first openings (121, 221) may have a bulging vertical cross-sectional profile such that a middle portion of each first opening (121, 221) laterally protrudes more than the upper portion and the lower portion of the first opening (121, 221).

In one embodiment, the first memory openings 121 can be formed as an array of openings, which can be a periodic two-dimensional array of openings. The first support openings 221 can be formed as discrete openings that are mutually separated from one another, and may, or may not, form a periodic two-dimensional array pattern. In one embodiment, the first support openings 221 may form a plurality of periodic one-dimensional array patterns.

Referring to FIGS. 4A and 4B, a fill material can be deposited in the first support openings 221 and in the first memory openings 121 simultaneously. The fill material can be an insulating material or a semiconducting material. The fill material has a composition different from the material of the insulating layers. Non-limiting examples of the fill material includes amorphous silicon, polycrystalline silicon ("polysilicon"), an amorphous silicon-germanium alloy, and a polycrystalline silicon-germanium alloy. Preferably the semiconductor material, such as amorphous silicon or polysilicon, is undoped (i.e., intrinsic). Polysilicon is preferred because it results in a lower mismatch between upper and lower portions of the memory openings. Without wishing to be bound by a particular theory, it is believed that amorphous silicon recrystallizes into polysilicon during subsequent thermal cycles and undergoes a corresponding volume change which may lead to misalignment of the memory opening portions. In contrast, as-deposited polysilicon is not subject to the same degree of volume change during subsequent thermal cycles, even though as-deposited polysilicon is deposited at a higher temperature (e.g., 575 to 700 C, such as 600 to 620 C). Excess portions of the deposited fill material can be removed from above the horizontal plane including the topmost surface of the first alternating stack (132, 142).

Remaining portions of the deposited fill material in the first openings (121, 221) are herein referred to as sacrificial fill structures (123, 223). The sacrificial fill structures (123, 223) include support opening fill structures 223 that are formed in the first support openings 221, and memory opening fill structures 123 that are formed in the first memory openings 121.

In case an inter-tier insulating layer 170 is provided, the sacrificial fill structures (123, 223) cam have a greater lateral extent (such as a diameter of a major axis) at the level of the inter-tier insulating layer 170 than at the levels of the first alternating stack (132, 142). For example, the fill material in the first support openings 221 and in the first memory openings 121 may be recessed to a level of the horizontal interface between the inter-tier insulating layer 170 and the first alternating stack (132, 142), and an isotropic etch can be performed to laterally expand the portions of the first support openings 221 and in the first memory openings 121 at the level of the inter-tier insulating layer 170 while the recessed fill material is present below the horizontal interface. Subsequently, an additional fill material (which may be the same as, or may be different from, the underlying fill material at the levels of the first alternating stack (132, 142)) can be deposited at the level of the inter-tier insulating layer 170 to form the sacrificial fill structures (123, 223). The highest temperature of each thermal cycle during the subsequent formation of the second tier structure (232, 242, 265, 70) (to be described below) is lower than the highest temperature of each thermal cycle during formation of the first tier structure (12, 132, 142, 165) to reduce or avoid misalignment of the first portions 121 and second portions 181 of each respective memory opening 49. The temperature of the processing steps (e.g., the highest temperature of each thermal cycle) is maintained below 800 degrees Celsius, such as below 750 C (e.g., room temperature to 700 C) after formation of the sacrificial fill structures (123, 223) until formation of the second openings (181, 421) through the second tier structure (232, 242, 265, 70).

Figure 5A:
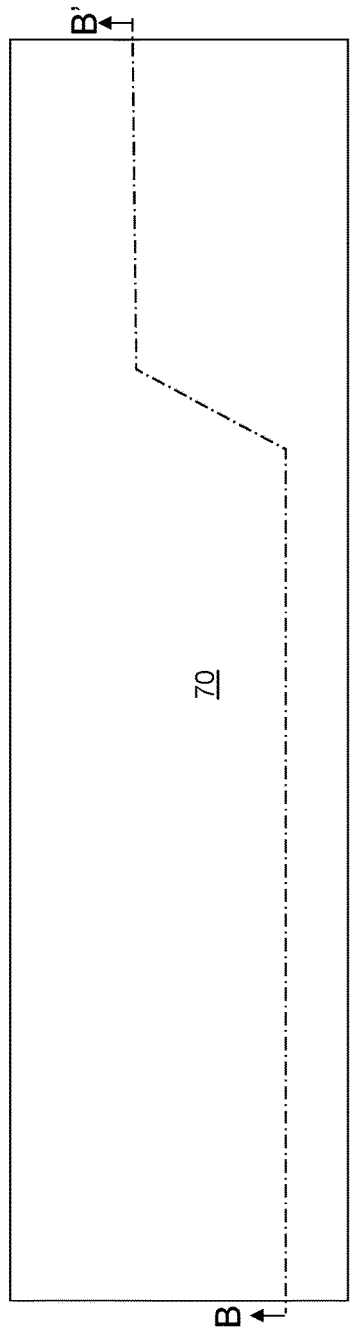
FIG. 5A is a schematic top-down view of a region of the exemplary structure after formation of a second alternating stack of second insulating layers and second sacrificial material layers according to an embodiment of the present disclosure.
Figure 5B:
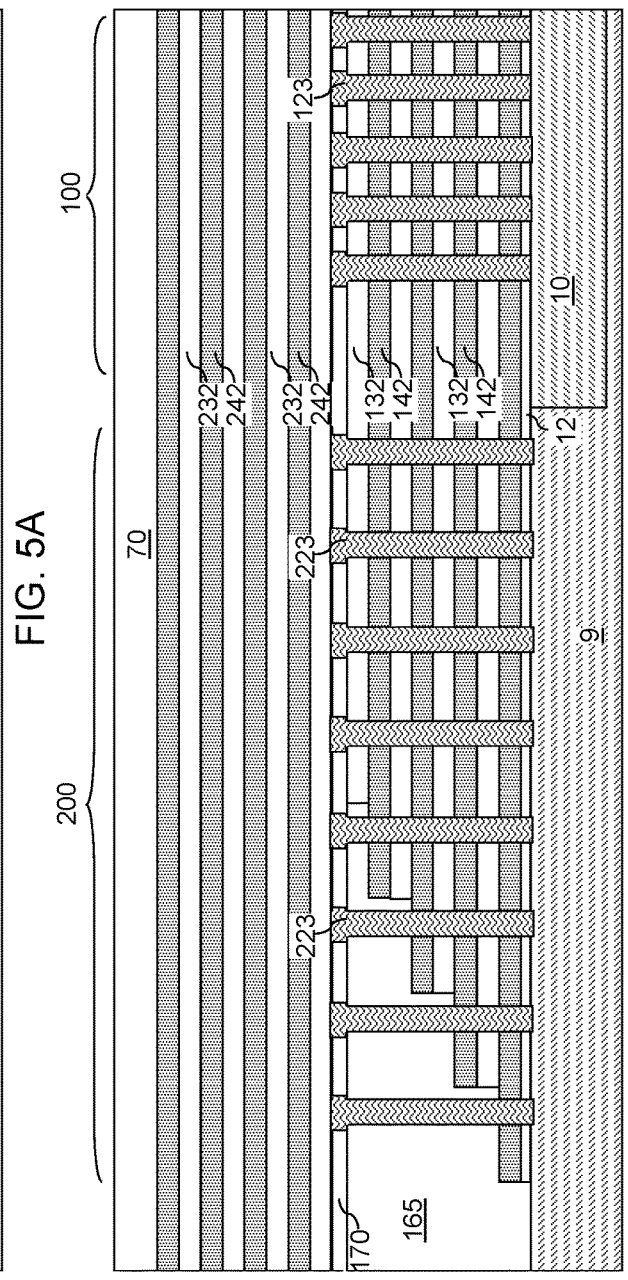
FIG. 5B is a schematic vertical cross-sectional view of along the vertical plane B-B' of the region of the exemplary structure of FIG. 5A.

Referring to FIGS. 5A and 5B, a second alternating stack (232, 242) of material layers is subsequently formed on the top surface of the first tier structure (12, 132, 142, 165). The second stack (232, 242) includes an alternating plurality of third material layers and fourth material layers. Each third material layer can include a third material, and each fourth material layer can include a fourth material that is different from the third material. In one embodiment, the third material can be the same as the first material of the first insulating layer 132, and the fourth material can be the same as the second material of the first sacrificial material layers 142.

In one embodiment, the third material layers and the fourth material layers can be second insulating layers 232 and second spacer layers that provide vertical spacing between vertically neighboring pairs of the second insulating layers 232. In one embodiment, the third material layers and the fourth material layers can be second insulating layers 232 and second sacrificial material layers 242, respectively. The third material of the second insulating layers 232 can be at least one insulating material. The fourth material of the second sacrificial material layers 242 is a sacrificial material that can be removed selective to the third material of the second insulating layers 232. The second sacrificial material layers 242 may comprise an insulating material, a semiconductor material, or a conductive material. The fourth material of the second sacrificial material layers 242 can be subsequently replaced with electrically conductive electrodes which can function, for example, as control gate electrodes of a vertical NAND device.

The second alternating stack (232, 242) can include second insulating layers 232 composed of the third material, and second sacrificial material layers 242 composed of the fourth material, which is different from the third material. In one embodiment, the third material of the second insulating layers 232 can be a hydrogen-containing silicon oxide material. In one embodiment, the third material of the second insulating layers 232 may be the same as the first material of the first insulating layers 132 as initially deposited.

In one embodiment, the hydrogen-containing silicon oxide material of the second insulating layers 232 as deposited can have the same composition as the hydrogen-containing silicon oxide material of the first insulating layers 132 as deposited. In this case, carbon can be present within each of the hydrogen-containing silicon oxide materials at a same atomic concentration as deposited. The carbon-to-silicon ratio in the hydrogen-containing silicon oxide material of the first insulating layers 132 does not significantly change during the at least one anneal process because carbon atoms do not significantly diffuse out of the hydrogen-containing silicon oxide material. Thus, the first insulating layers 132 and the second insulating layers 232 can have a same atomic ratio of carbon atoms to silicon atoms at this processing step and in subsequent processing steps.

In one embodiment, the hydrogen-containing silicon oxide material of the second insulating layers 232 can be deposited by thermal decomposition or plasma decomposition of a hydrogen-containing precursor material that can be decomposed, or reacted, into a silicon oxide material. Alternatively, the hydrogen-containing silicon oxide material of the second insulating layers 232 can be deposited by thermal decomposition or plasma decomposition of a precursor material in the presence of a hydrogen carrier gas. For example, the hydrogen-containing silicon oxide material of the second insulating layers 232 can be deposited by thermal decomposition or plasma decomposition of tetraethylorthosilicate (TEOS) or other organic or inorganic hydrogen-containing precursors for silicon oxide deposition.

A thermal chemical vapor deposition process, a plasma-assisted chemical vapor deposition process, or an atomic layer deposition process can be employed to deposit the hydrogen-containing silicon oxide material of the insulating layers 232. The hydrogen-containing silicon oxide material of the second insulating layers 232 can be doped with additional intentional or unintentional dopants such as boron, phosphorus, fluorine, and/or carbon. In one embodiment, the second insulating layers 232 include a hydrogen-containing silicon oxide material including hydrogen at an atomic concentration within a range from 2% to 15%, such as from 3.0% to 12.0%. Generally, the hydrogen-containing silicon oxide material of the second insulating layers 232 can have a wide range of atomic hydrogen concentration depending on deposition conditions. In case a carbon-containing precursor gas (such as TEOS) is employed to deposit the hydrogen-containing silicon oxide material, the deposited hydrogen-containing silicon oxide material of the second insulating layers 232 can include carbon atoms at an atomic concentration greater than 10 parts per million (which may be in a range from 30 parts per million to 300 parts per million).

The fourth material of the second sacrificial material layers 242 can be a sacrificial material that can be removed selective to the first material of the second insulating layers 232. The second sacrificial material layers 242 may comprise an insulating material, a semiconductor material, or a conductive material. The fourth material of the second sacrificial material layers 242 can be subsequently replaced with electrically conductive electrodes which can function, for example, as control gate electrodes of a vertical NAND device. Non-limiting examples of the fourth material include silicon nitride, an amorphous semiconductor material (such as amorphous silicon), and a polycrystalline semiconductor material (such as polysilicon). In one embodiment, the fourth material can be the same as the second material. In one embodiment, the second sacrificial material layers 242 can be material layers that comprise silicon nitride or a semiconductor material including at least one of silicon and germanium.

In one embodiment, the second insulating layers 232 can include a second hydrogen-containing silicon oxide, and sacrificial material layers can include silicon nitride sacrificial material layers. The second material of the second insulating layers 232 can be deposited, for example, by plasma enhanced chemical vapor deposition (PECVD) or atmospheric pressure chemical vapor deposition (APCVD). For example, tetraethylorthosilicate (TEOS) can be employed as the precursor material for the CVD process for depositing the hydrogen-containing silicon oxide material of the second insulating layers 232.

Because of the high hydrogen content in the hydrogen-containing silicon oxide material of the second insulating layers 232, the etch rate of the hydrogen-containing silicon oxide material can be significantly higher than the etch rate of thermal silicon oxide or densified silicon oxides that are deposited by CVD and annealed at a high temperature to reduce the hydrogen content. For example, the etch rate of the hydrogen-containing silicon oxide material of the second insulating layers 232 in a 100:1 diluted hydrofluoric acid can be greater than the etch rate of thermal oxide in a 100:1 diluted hydrofluoric acid at least by a factor of 2, and/or by a factor greater than 3.

The fourth material of the second sacrificial material layers 242 can be formed, for example, CVD or atomic layer deposition (ALD).

The thicknesses of the second insulating layers 232 and the second sacrificial material layers 242 can be in a range from 20 nm to 50 nm, although lesser and greater thicknesses can be employed for each second insulating layer 232 and for each second sacrificial material layer 242. The number of repetitions of the pairs of a second insulating layer 232 and a second sacrificial material layer 242 can be in a range from 2 to 1,024, and typically from 8 to 256, although a greater number of repetitions can also be employed. In one embodiment, each second sacrificial material layer 242 in the second alternating stack (232, 242) can have a uniform thickness that is substantially invariant within each respective second sacrificial material layer 242.

An insulating cap layer 70 can be subsequently formed over the second alternating stack (232, 242). The insulating cap layer 70 includes a dielectric material that is different from the material of the second sacrificial material layers 242. The insulating cap layer 70 includes a dielectric material that may be the same as, or different from, the material of the second insulating layers 232. In one embodiment, the insulating cap layer 70 can include a hydrogen-containing silicon oxide material. The insulating cap layer 70 and the second alternating stack (232, 242) constitute a second tier structure (232, 242, 265). If desired, a silicon nitride polish stop layer is formed over the insulating cap layer 70 at a temperature below 800 C by LPCVD, APCVD or PECVD. The polish stop layer is removed during chemical mechanical planarization (i.e., polishing) of portion 265 as will be described below.

Figure 6A:
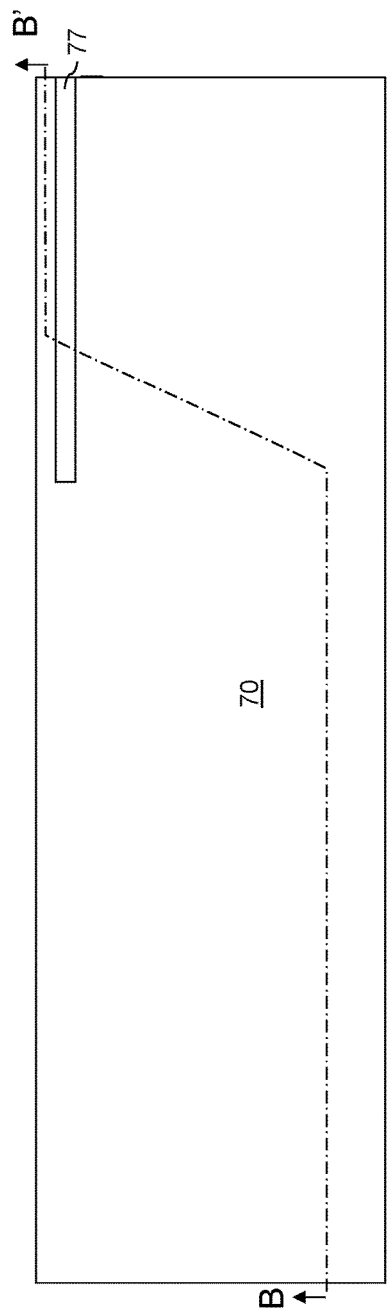
FIG. 6A is a schematic top-down view of a region of the exemplary structure after formation of second stepped surfaces and a second retro-stepped dielectric material portion according to an embodiment of the present disclosure.
Figure 6B:
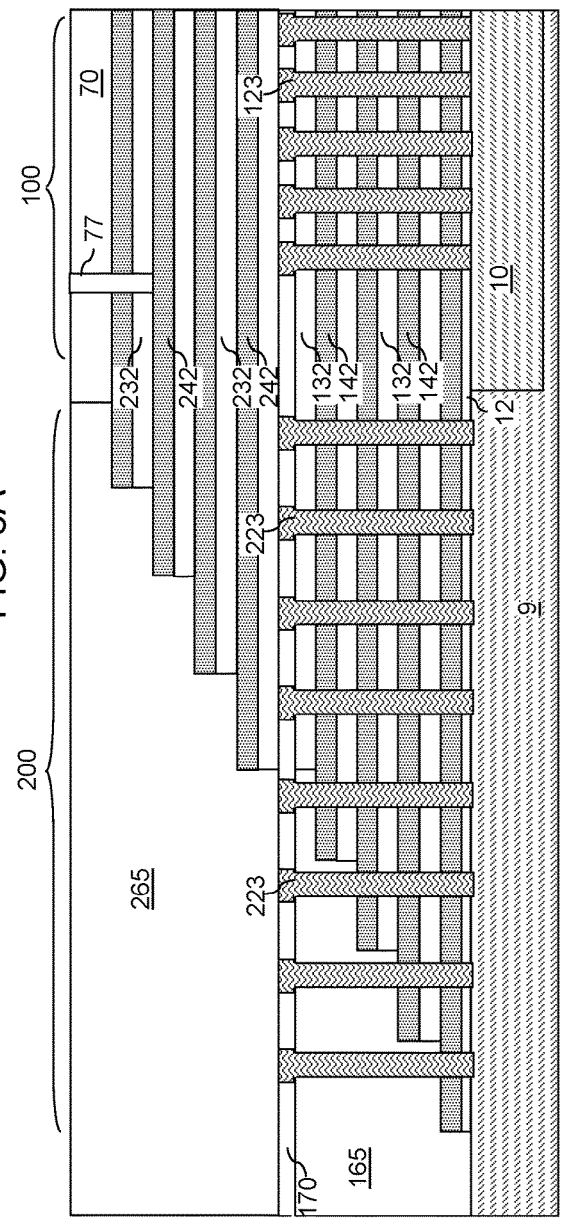
FIG. 6B is a schematic vertical cross-sectional view along the vertical plane B-B' of the region of the exemplary structure of FIG. 6A.

Referring to FIGS. 6A and 6B, the second tier structure (232, 242, 265) can be patterned to form second stepped surfaces. The second stepped surfaces form a second terrace region, which is located within an area of the contact region 200 and is laterally offset from the area of the first terrace region toward the memory array region 100. The contact region 200 includes the first terrace region in which the first stepped surfaces are formed, and the second terrace region in which the second stepped surfaces are formed.

Underlying layers within the second alternating stack (232, 242) laterally extend farther than overlying layers within the second alternating stack (232, 242) in the second terrace region. The second stepped surfaces can be formed, for example, by forming a mask layer with an opening therein, etching a cavity within the level of the insulating cap layer 70, and iteratively expanding the etched area and vertically recessing the cavity by etching each pair of a second insulating layer 232 and a second sacrificial material layer 242 located directly underneath the bottom surface of the etched cavity within the etched area. The second alternating stack (232, 242) is patterned such that each underlying second sacrificial material layer 242 laterally protrudes farther than any overlying second sacrificial material layer 242 in the etched region, and each underlying second insulating layer 232 laterally protrudes farther than overlying second insulating layers 232 in the etched region. A stepped cavity is formed within each contact region 200. Each stepped cavity that is formed at this step is herein referred to as a second stepped cavity.

A dielectric material is deposited to fill the second stepped cavities. Excess portions of the dielectric material overlying the topmost surface of the second alternating stack (232, 242), are removed for example, by chemical mechanical planarization. Each remaining portion of the deposited dielectric material forms a second dielectric material portion, which is herein referred to as a second retro-stepped dielectric material portion 265. The second retro-stepped dielectric material portions 265 are formed on the second stepped surfaces of the second terrace regions. The second dielectric material portions 265 are retro-stepped. The second tier structure, which is also referred to as a second stack structure, comprises the second alternating stack (232, 242) and the second retro-stepped dielectric material portions 265.

In one embodiment, the second retro-stepped dielectric material portions 265 can be formed by depositing a second silicon oxide fill material over the second terrace regions. In one embodiment, the second silicon oxide fill material can include a hydrogen-containing silicon oxide material. A thermal chemical vapor deposition process, a plasma-assisted chemical vapor deposition process, or an atomic layer deposition process can be employed to deposit the hydrogen-containing silicon oxide material of the second retro-stepped dielectric material portions 265. The deposition temperature of the second silicon oxide fill material can be less than 650 degrees Celsius, and may be less than 550 degrees Celsius, such as 250 to 500 C, for example, 300 to 450 C. The hydrogen-containing silicon oxide material of the second retro-stepped dielectric material portions 265 can be doped with additional intentional or unintentional dopants such as boron, phosphorus, fluorine, and/or carbon. In one embodiment, the second retro-stepped dielectric material portions 265 include a hydrogen-containing silicon oxide material including hydrogen at an atomic concentration within a range from 2% to 15%, such as from 3.0% to 12.0%. The atomic concentration of hydrogen in the second retro-stepped dielectric material portions 265 may be the same as, or may be different from, the atomic concentration of hydrogen in the second insulating layers 232.

Because of the high hydrogen content in the hydrogen-containing silicon oxide material of the second retro-stepped dielectric material portions 265, the etch rate of the hydrogen-containing silicon oxide material in the second retro-stepped dielectric material portions 265 can be significantly higher than the etch rate of thermal silicon oxide or densified silicon oxides (e.g., densified TEOS (dTEOS) first retro-stepped dielectric material portions 165) that are deposited by CVD and annealed at a high temperature (e.g., at 800 to 1200 C) to densify them and to reduce their hydrogen content. For example, the etch rate of the hydrogen-containing silicon oxide material of the second retro-stepped dielectric material portions 265 in a 100:1 diluted hydrofluoric acid can be greater than the etch rate of thermal oxide in a 100:1 diluted hydrofluoric acid at least by a factor of 2, and/or by a factor greater than 3. Furthermore, the etch rate of the hydrogen-containing silicon oxide material of the second retro-stepped dielectric material portions 265 in a 100:1 diluted hydrofluoric acid is different from that of the first retro-stepped dielectric material portions 165 that contain a lower amount of hydrogen. Likewise the etch rate of the hydrogen-containing silicon oxide material of the second insulating layers 242 in a 100:1 diluted hydrofluoric acid is different from that of the silicon oxide first insulating layers 132 that contain a lower amount of hydrogen. Preferably, no annealing steps are performed after formation of the sacrificial fill structures (123, 223) until formation of the second openings (181, 421) through the second tier structure (232, 242, 265, 70).

The first stepped surfaces and the second stepped surfaces are collectively referred to as "stepped surfaces." A first portion of the stepped surfaces is the first stepped surfaces located in the first tier structure (12, 132, 142, 165). As second portion of the stepped surfaces is the second stepped surfaces located in the second tier structure (232, 242, 70, 265). The first stepped surfaces and the second stepped surfaces are located within the contact region 200.

The region of the stepped surfaces is herein referred to as a terrace region, which includes the first terrace region and the second terrace region. Each sacrificial material layer (142, 242) among the first and second sacrificial material layers (142, 242) that is not a bottommost first sacrificial material layer 142 can laterally extend less than underlying layers among the first and second sacrificial material layers (142, 242). The terrace region includes stepped surfaces of the first and second alternating stacks (132, 142, 232, 242) that continuously extend from a bottommost layer within the first alternating stack (132, 142) to a topmost layer within the second alternating stack (232, 242).

As shown in FIGS. 6A and 6B, drain select level separator trenches are formed through the drain select levels of the second alternating stack and are filled with a planarized insulating material, such as silicon oxide, to form dielectric filled separator trenches 77. The dielectric filled separator trenches 77 extend through and divide only the second sacrificial material layers 242 that will be replaced with drain select gate electrodes but not the word lines in subsequent steps. Thus, the dielectric filled separator trenches 77 are located only in the drain select levels of the second alternating stack. Preferably, the silicon oxide filling the dielectric filled separator trenches 77 is formed from a TEOS source by a CVD process at a temperature below 550 C, such as 300 to 450 C without performing a subsequent densification anneal at 800 C or above prior to forming the second openings (181, 421).

Referring to FIGS. 7A and 7B, second openings (181, 421) are formed through the second tier structure (232, 242, 265, 70) to the top surface of the first tier structure (12, 132, 142, 165). The second openings (181, 421) include second memory openings 181 that are formed in the memory array region 100 and second support openings 421 that are formed in the contact region 200. Each second memory opening 181 can be formed on top of a respective memory opening fill structure 123 (which are present in the first memory openings 121). Each second support openings 421 can be formed on top of a respective support opening fill structure 223.

For example, a lithographic material stack (not shown) including at least a photoresist layer can be formed over the second tier structure (232, 242, 265, 70), and can be lithographically patterned to form openings within the lithographic material stack. The pattern in the lithographic material stack can be transferred through the entirety of the second tier structure (232, 242, 265, 70) by at least one anisotropic etch that employs the patterned lithographic material stack as an etch mask. Portions of the second tier structure (232, 242, 265, 70) underlying the openings in the patterned lithographic material stack are etched to form the second openings (181, 421). In other words, transfer of the pattern in the patterned lithographic material stack through the second tier structure (232, 242, 265, 70) forms the second openings (181, 421).

The lateral dimensions (e.g., a diameter) of the second openings (181, 421) can be comparable to the lateral dimensions of the first openings (121, 221). For example, the lateral dimensions of the second openings (181, 421) can be from about 20 nm to 200 nm at an upper portion of each second opening (181, 421), and can be about 10 nm to 150 nm at a lower portion of each second opening (181, 421). In one embodiment, the second memory openings 181 and the first memory openings 121 can be formed as an array of openings, which can be a periodic two-dimensional array of openings. The second support openings 421 and the first support openings 221 can be formed as discrete openings that are mutually separated from one another, and may, or may not, form a periodic two-dimensional array pattern. Subsequently, the patterned lithographic material stack can be subsequently removed, for example, by ashing.

Figure 8D:
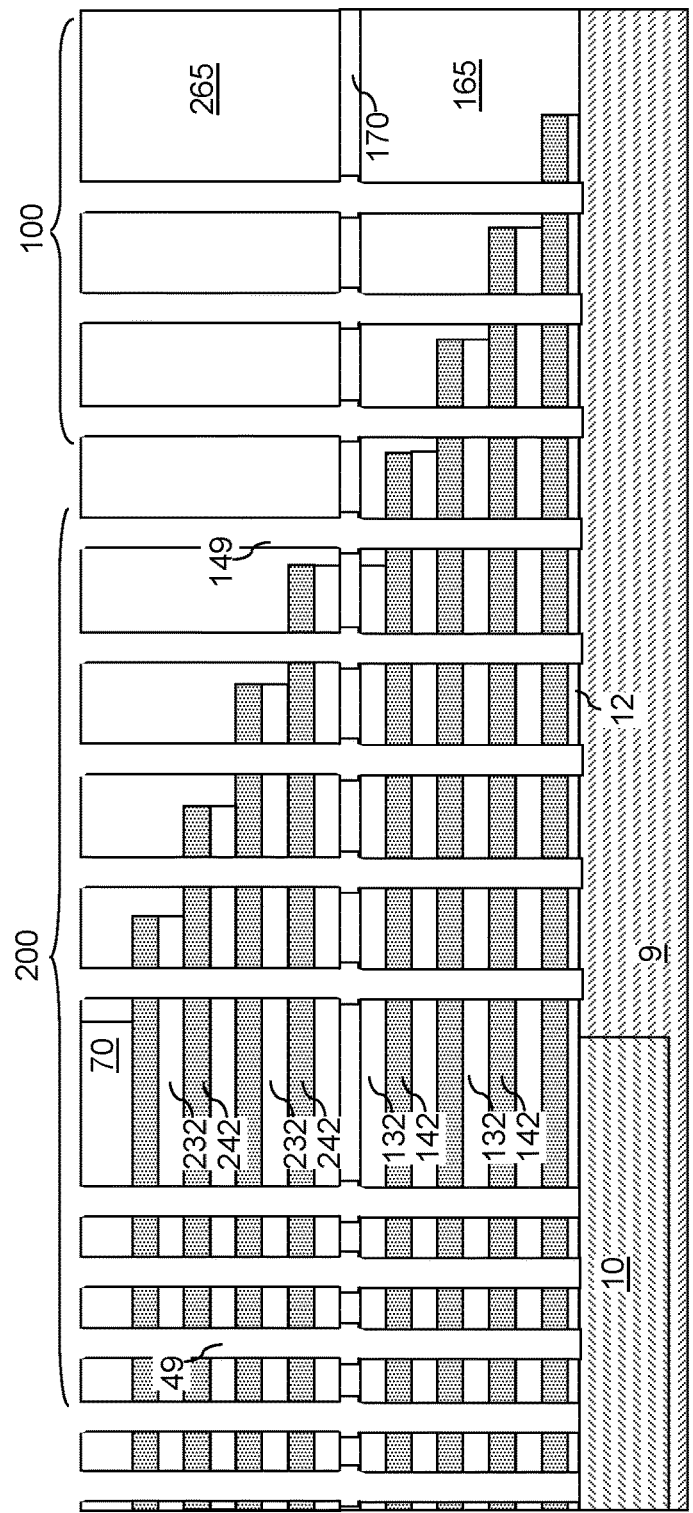
FIG. 8D is a schematic vertical cross-sectional view along the vertical plane B-B' of a second region R2 of the exemplary structure of FIG. 8C.

Referring to FIGS. 8A-8D, the memory opening fill structures 123 and the support opening fill structures 223 can be removed from underneath the second memory openings 181 and the second support openings 421, respectively. FIG. 8B is a schematic top-down view of a first region R1 of the exemplary structure as shown in FIG. 8C, and FIG. 8D is a schematic top-down view of a second region R2 of the exemplary structure as shown in FIG. 8C. FIG. 8A is a top-down view of the first region R1 as shown in FIG. 8B.

An isotropic etch or an anisotropic etch may be performed to remove the materials of the memory opening fill structures 123 and the support opening fill structures 223 selective to the materials of the insulating layers (132, 232), the sacrificial material layers (142, 242), and the insulating cap layer 70. In one embodiment, a wet etch process employing a KOH solution can be employed to remove the material of the memory opening fill structures 123 and the support opening fill structures 223. The single crystalline surface of the semiconductor material layer 10 can be physically exposed after removal of the memory opening fill structures 123 and the support opening fill structures 223. Alternatively, if the material of the memory opening fill structures 123 and the support opening fill structures 223 includes a silicon-germanium alloy, a solution including hydrofluoric acid and hydrogen peroxide can be employed to remove the material of the memory opening fill structures 123 and the support opening fill structures 223. Optionally, an overetch may be performed into the semiconductor material layer 10.

Removal of the memory opening fill structures 123 from underneath the second memory openings 181 forms inter-tier memory openings 49 extending through the first and second tier structures (132, 142, 165, 232, 242, 265, 70). Each inter-tier memory opening 49 includes a volume of a first memory opening 121 and a second memory opening 181. Each inter-tier memory openings 49 extends through the entirety of the first alternating stack (132, 142) and the second alternating stack (232, 242). Removal of the support opening fill structures 223 from underneath the second support openings 421 forms inter-tier support openings 149 extending through the first and second tier structures (132, 142, 165, 232, 242, 265, 70). Each inter-tier support openings 149 extends through a second portion of the stepped surfaces in the terrace region and through the second retro-stepped dielectric material portion 265.

The temperature of the exemplary structure is maintained below 800 degrees Celsius (such as 750 degrees Celsius and below, such as within a range from 20 degrees Celsius and 750 degrees Celsius) throughout the processing steps after the at least one anneal process that densifies the first tier structure (12, 132, 142, 165). Generally, the concept of "thermal budget" is employed to describe the impact of high temperature processing on a structure. The thermal budget can be measured by material distortion induced by the high temperature processing, such as high-temperature induced distortion of the exemplary structure as measured in physical dimensions, and more specifically, changes in relevant lateral dimension for lithographic alignment purposes. By limiting the temperature range to which the exemplary structure is subject to between formation of the memory opening fill structures 123 and the support opening fill structures 223 in the first tier structure (12, 132, 142, 165) and formation of the second openings (181, 421) through the second tier structure (232, 242, 70, 265), thermally induced distortion of the first tier structure (12, 132, 142, 165, 123, 223), the optional inter-tier dielectric layer 170, and the second tier structure (232, 242, 70, 265) can be reduced or eliminated.

According to an aspect of the present disclosure, the first and second tier structures are maintained within a temperature range less than 800 degrees Celsius, such as 750 C or less, between formation of the second alternating stack and formation of the inter-tier memory openings 49, and thus, between the processing steps of FIGS. 3A and 3B and the processing steps of FIGS. 8A-8D. For example, the at least one anneal process (e.g., the first, second and/or third anneal process) conducted on the first tier structure at a temperature of 800 C or above is not performed on the second tier structure until at least the inter-tier memory openings 49 are formed through first and second tier structures. Furthermore, the dielectric filled separator trenches 77 can be formed using a lower temperature deposition process, such as TEOS source PECVD silicon oxide deposition process at a temperature of 550 C or below.

As a consequence, the change in the lateral dimensions of the various elements in the first tier structure (12, 132, 142, 165) that are formed after the at least one anneal process is also minimized. For example, the second openings (181, 421) can be formed at the processing steps of FIGS. 7A and 7B employing the same lithographic mask as the first openings (121, 221) that are formed at the processing steps of FIGS. 3A and 3B such that the lateral extent of the pattern of the second openings (181, 421) is substantially the same, or the same, as the lateral extent of the pattern of the first openings (121, 221).

For example, as shown in FIG. 8C, a first lateral extent L1 of the array of inter-tier memory openings 49 can be measured between outermost inter-tier memory openings 49 that are most proximal to a respective one of the first retro-stepped dielectric material portion 165 at the level of the first tier structure (12, 132, 142, 165) along the direction perpendicular to sidewalls of the stepped surfaces. A second lateral extent L2 of the array of inter-tier memory openings 49 can be measured between the outermost inter-tier memory openings 49 that are most proximal to the respective one of the second retro-stepped dielectric material portion 265 and overlying the first retro-stepped dielectric material portions 165 at the level of the second tier structure (232, 242, 70, 265) along the direction perpendicular to sidewalls of the stepped surfaces. The second lateral extent L2 can be substantially the same, or the same, as the first lateral extent L1 such that a coincident overlay of the second openings (181, 421) with respect to the first openings (121, 221) in the first region R1 and a coincident overlay of the second openings (181, 421) with respect to the first openings (121, 221) in the second region R2 can simultaneously occur. Even if the overlay between the second openings (181, 421) with respect to the first openings (121, 221) is not perfect, the overlay shift in the second region R2 can be the same as the overlay shift in the first region R1. Thus, the second openings (181, 421) can be aligned to the first openings (121, 221) over the entirety of the lithographic exposure field that patterns the second openings (181, 421) (which can be the same as the size of a single memory plane (e.g., memory array region 100), a single chip or multiple chips depending on the chip size) to ensure that each second memory opening 181 has a sufficient overlap area with a respective underlying first memory opening 121.

The overlap between the second opening (181, 421) and the first opening (121, 221) within each inter-tier opening (49, 149) can be controlled such that each inter-tier memory opening 49 extends through the first tier structure (12, 132, 142, 165) and the second tier structure (232, 242, 70, 265) with the following characteristics. The first characteristic is that the area of the inter-tier memory opening 49 at the interface between the second tier structure (232, 242, 70, 265) and the inter-tier dielectric material layer 170 (or with the first tier structure (12, 132, 142, 165 in case the inter-tier dielectric material layer 170 is not present) is at least 50%, and preferably at least 70%, of the area of the inter-tier memory opening 49 at the level of the bottommost second insulating layer 232. The first feature ensures that each layer within memory stack structures can be subsequently formed as a continuous structure in the inter-tier memory openings 49. The second characteristic is that at least 50% of the area of each inter-tier memory opening 49 at the interface between the second tier structure (232, 242, 70, 265) and the inter-tier dielectric material layer 170 has an areal overlap with the bottom surface of the inter-tier memory opening 49 (which is the area of the physically exposed portion of the semiconductor material layer 10 underneath the inter-tier memory opening 49). The second feature ensures that a sufficient area of the semiconductor material layer is physically exposed to provide physical contact with a vertical semiconductor channel in subsequent processing steps.

Figure 9C:
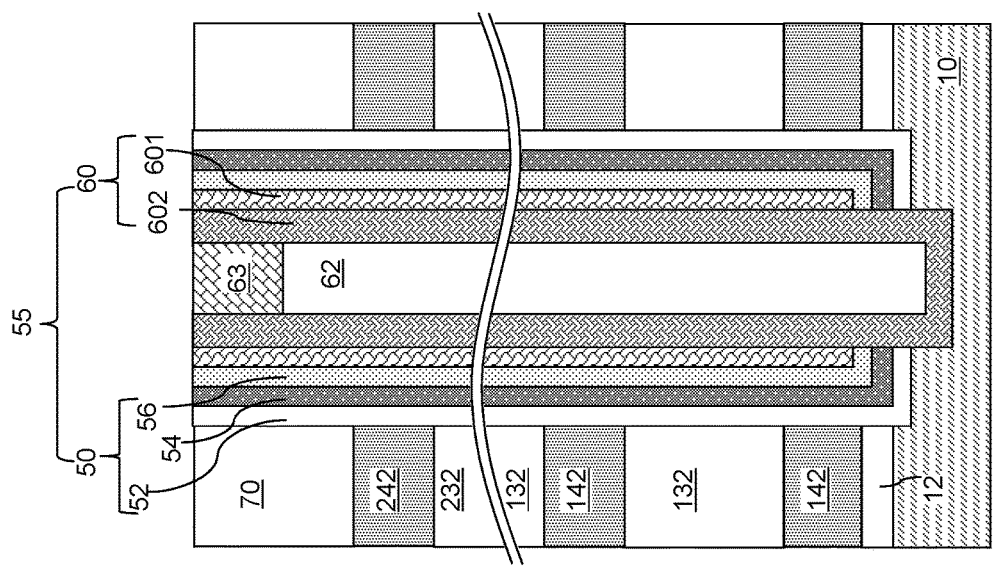
FIG. 9C is a schematic vertical cross-sectional view of a memory opening fill structure according to an embodiment of the present disclosure.

Referring to FIGS. 9A, 9B, and 9C, memory opening fill structures 58 are formed in the inter-tier memory openings 49, and support pillar structures 20 are formed in the inter-tier support openings 149. Each memory opening fill structure 58 includes a drain region 63 and a memory stack structure 55, which includes a memory film 50 and a vertical semiconductor channel 60.

Optionally, epitaxial channel portions (not shown) may be formed by a selective epitaxy process at the bottom of the inter-tier memory openings 49 and the inter-tier support openings 149. The epitaxial channel portions, if present, can comprise a single crystalline semiconductor material in epitaxial alignment with the single crystalline substrate semiconductor material of the semiconductor material layer 10 (or the substrate semiconductor layer 9).

A memory opening fill structure 58 is formed within each inter-stack memory opening 49, and a support pillar structure 20 is formed within each inter-stack support opening 149. The memory opening fill structures 58 and the support pillar structures 20 can be formed simultaneously by depositing a same set of material portions. The memory opening fill structures 58 and the support pillar structures 20 are formed through the first and second tier structures (12, 132, 142, 165, 232, 242, 70, 265).

Specifically, a stack of layers including an optional blocking dielectric layer 52, a charge storage layer 54, a tunneling dielectric layer 56, and an optional first semiconductor channel layer 601 can be sequentially deposited in each of the inter-tier memory openings 49 and the inter-tier support openings 149.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) can have vertically coincident sidewalls, and the charge storage layer 54 can be formed as a single continuous layer.

In another embodiment, the sacrificial material layers (142, 242) can be laterally recessed with respect to the sidewalls of the insulating layers (132, 232), and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A cavity is formed in the volume of each memory opening 49 that is not filled with the deposited material layers (52, 54, 56, 601).

The optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each cavity can be removed to form openings in remaining portions thereof. Each of the first semiconductor channel layer 601, the tunneling dielectric layer 56, the charge storage layer 54, and the blocking dielectric layer 52 can be etched by anisotropic etch process.

The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers (142, 242) constitutes a charge storage region.

A surface of the semiconductor substrate layer 10 (or a surface of an epitaxial channel portion) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each cavity can be vertically recessed so that the recessed semiconductor surface underneath the cavity is vertically offset from the topmost surface of the semiconductor substrate layer 10 (or a topmost surface of an epitaxial channel portion) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

A second semiconductor channel layer 602 can be deposited directly on the semiconductor surface of the semiconductor substrate layer 10 (or on an epitaxial channel portion, if present), and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the cavity in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

In case the cavity in each memory opening is not completely filled by the second semiconductor channel layer 602, a dielectric core layer can be deposited in the cavity to fill any remaining portion of the cavity within each memory opening. The dielectric core layer includes a dielectric material such as silicon oxide or organosilicate glass. The dielectric core layer can be deposited by a conformal deposition method such as low pressure chemical vapor deposition (LPCVD), or by a self-planarizing deposition process such as spin coating.

The horizontal portion of the dielectric core layer can be removed, for example, by a recess etch from above the top surface of the insulating cap layer 70. Each remaining portion of the dielectric core layer constitutes a dielectric core 62. Further, the horizontal portion of the second semiconductor channel layer 602 located above the top surface of the insulating cap layer 70 can be removed by a planarization process, which can employ a recess etch or chemical mechanical planarization (CMP).

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each set of a memory film 50, a vertical semiconductor channel 60, and an optional dielectric core 62 formed within an inter-tier memory opening 49 constitutes a memory stack structure 55. Each set of a memory film 50, a vertical semiconductor channel 60, and an optional dielectric core 62 formed within an inter-tier support opening 149 constitutes a support pillar structure 20.

The top surface of each dielectric core 62 can be further recessed within each memory opening, for example, by a recess etch to a depth that is located between the top surface of the insulating cap layer 70 and the bottom surface of the insulating cap layer 70. A doped semiconductor material can be deposited within each recessed region above the dielectric cores 62. The doped semiconductor material can be, for example, doped polysilicon. Excess portions of the deposited semiconductor material can be removed from above the top surface of the insulating cap layer 70, for example, by chemical mechanical planarization (CMP) or a recess etch. Each remaining portion of the doped semiconductor material overlying the memory stack structure 55 constitutes a drain region 63, which is a top active region of a vertical field effect transistor including a respective vertical semiconductor channel 60. Each remaining portion of the doped semiconductor material overlying the support pillar structure 20 constitutes a dummy drain region 163, which has the same composition as the drain regions 63. The dummy drain regions 163 are not electrically active by preventing formation of any electrical connection to the dummy drain region 163. In one embodiment, the drain regions 63 and the dummy drain regions 163 can be heavily doped. In one embodiment, the drain regions 63 and the dummy drain regions 163 can include electrical dopants (p-type dopants or n-type dopants) at an atomic concentration greater than $5.0 \times 10^{19}/cm^3$.

Each of the plurality of memory stack structures 55 and the support pillar structures 20 includes a respective instance of a layer stack (52, 54, 56, 60) that includes a first dielectric material layer (such as a blocking dielectric layer 52), a second dielectric material layer (such as a tunneling dielectric layer 56), and a semiconductor material layer (such as a vertical semiconductor channel 60). In one embodiment, each layer in the layer stack (52, 54, 56, 60) can be a conformal material layer having a uniform thickness throughout. In one embodiment, each instance of the first dielectric material layer (such as the blocking dielectric layer 52) has a first thickness throughout, each instance of the second dielectric material layer (such as the tunneling dielectric layer 56) has a second thickness throughout, and each instance of the semiconductor material layer (such as a vertical semiconductor channel 60) includes a portion having a third thickness throughout (such as a portion including a layer stack of the first semiconductor channel layer 601 and the second semiconductor channel layer 602).

A top end of each instance of the semiconductor material layer (such as a vertical semiconductor channel 60) is contacted by a bottom surface of a respective doped semiconductor material portion (such as a drain region 63 or a dummy drain region 163) including electrical dopants at an atomic concentration greater than $5.0 \times 10^{19}/cm^3$.

Generally, each of the plurality of memory stack structures 55 comprises, from outside to inside, a charge storage layer 54, a tunneling dielectric layer 56, and a semiconductor material layer such as a vertical semiconductor channel

60. The temperature of the exemplary structure can be maintained below 750 degrees Celsius throughout formation of the plurality of memory opening fill structures 58, and thus, throughout formation of the plurality of memory stack structures 55.

Each of the first insulating layers 132 and the second insulating layers 232 can have the same material composition and the same density as deposited. The at least one anneal process increases the density of the hydrogen-containing silicon oxide material of the first insulating layers 132 through loss of hydrogen atoms. Thus, the first insulating layers 132 after formation of the plurality of memory stack structures 55 can have a higher density and a lower hydrogen content (e.g., 2 atomic percent or less, such as 0.5 to 1 atomic percent) than the second insulating layers 232 (which have a higher hydrogen content, such as 2.5 atomic percent or greater, such as 3 to 12 atomic percent) after formation of the plurality of memory stack structures 55.

Figure 10A:
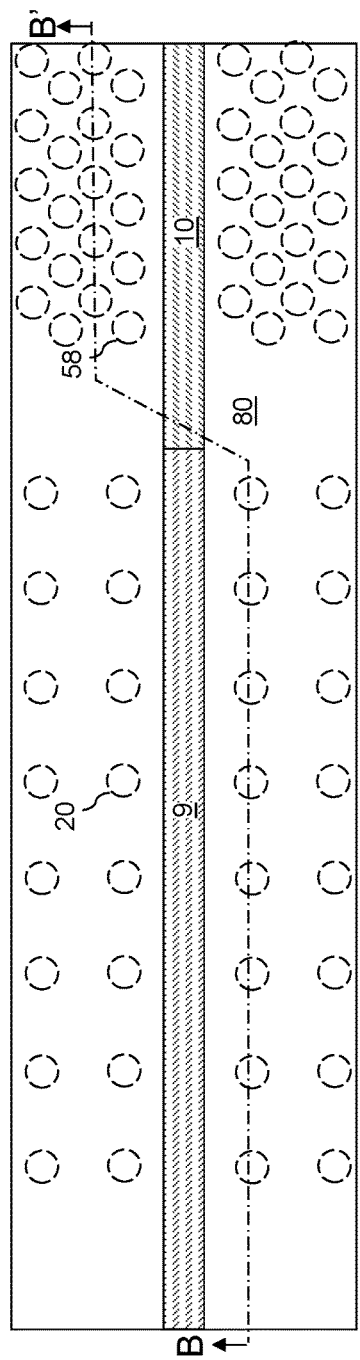
FIG. 10A is a top-down view of a region of the exemplary structure after formation of a contact level dielectric layer and a backside contact trench according to an embodiment of the present disclosure.
Figure 10B:
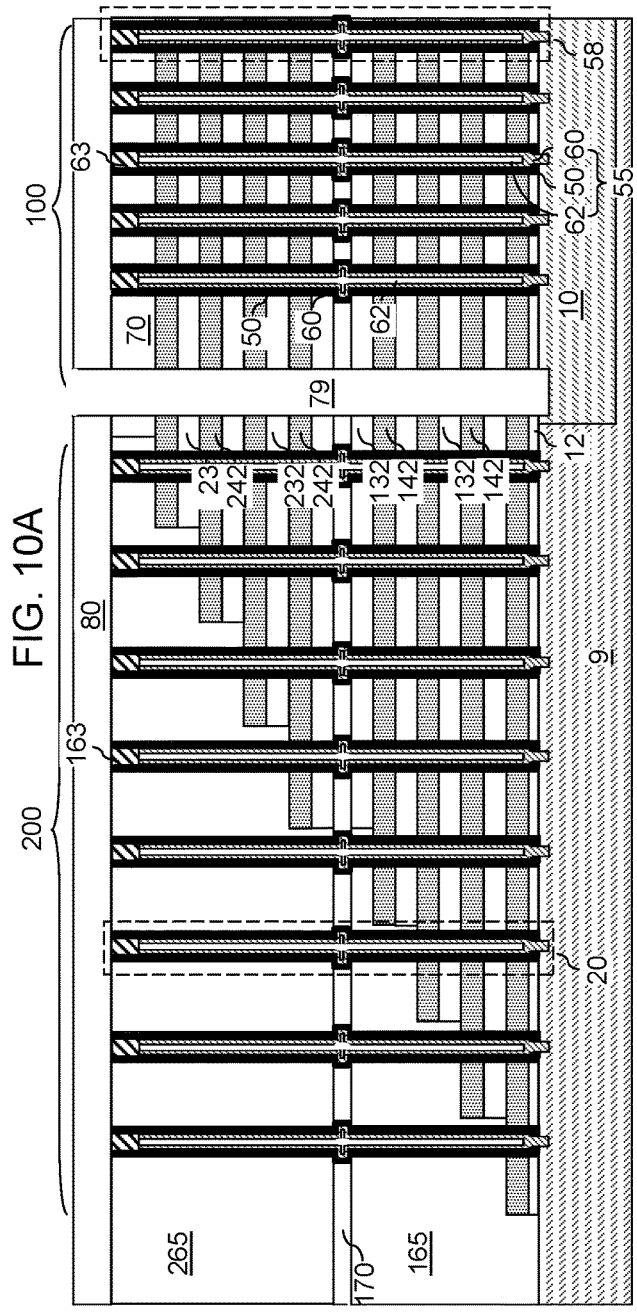
FIG. 10B is a schematic vertical cross-sectional view along the vertical plane B-B' of the region of the exemplary structure of FIG. 10A.

Referring to FIGS. 10A and 10B, a contact level dielectric layer 80 can be formed over the second tier structure (232, 242, 265, 70). The contact level dielectric layer 80 includes a dielectric material such as silicon oxide, a dielectric metal oxide, and/or organosilicate glass. In one embodiment, the contact level dielectric layer 80 can be composed primarily of a silicon oxide material. The thickness of the contact level dielectric layer 80 can be in a range from 50 nm to 1,000 nm, although lesser and greater thicknesses can also be employed.

In case the first and second spacer layers in the first and second alternating stacks (132, 142, 232, 242) are formed as first sacrificial material layers 142 or second sacrificial material layers 242, the first and second sacrificial material layers (142, 242) can be replaced with electrically conductive layers after formation of the plurality of memory stack structures 55. While the present disclosure is described employing an embodiment in which the spacer material layers are formed sacrificial material layers (142, 242) and are subsequently replaced with electrically conductive layers, embodiments are expressly contemplated herein in which the spacer material layers are formed as electrically conductive layers, in which case replacement of the sacrificial material layers with electrically conductive layers is unnecessary.

A photoresist layer (not shown) can be applied over the contact level dielectric layer 80, and is lithographically patterned to form at least one elongated opening in each area in which formation of a backside contact via structure is desired. The pattern in the photoresist layer can be transferred through the contact level dielectric layer 80, the second tier structure (232, 242, 265, 70), and the first tier structure (12, 132, 142, 165) employing an anisotropic etch to form the at least one backside trench 79, which extends at least to the top surface of the substrate (9, 10). In one embodiment, the at least one backside trench 79 can include a source contact opening in which a source contact via structure can be subsequently formed.

Referring to FIGS. 11A and 11B, an etchant that selectively etches the second material of the sacrificial material layers (142, 242) with respect to the materials of the insulating layers (132, 232) and the semiconductor material(s) of the substrate (9, 10) can be introduced into the at least one backside trench 79, for example, employing an etch process. Backside recesses (143, 243) are formed in volumes from which the sacrificial material layers (142, 242) are removed. Specifically, first backside recesses 143 are formed in the volumes from which the first sacrificial material layers 142 are removed, and second backside recesses 243 are formed in the volumes from which the second sacrificial material layers 242 are removed.

The removal of the second material of the sacrificial material layers (142, 242) can be selective to the materials of the insulating layers (132, 232), the materials of the retro-stepped dielectric material portions (165, 265), the semiconductor material(s) of the substrate (9, 10), and the material of the outermost layer of the memory films 50. Each backside recess (143, 243) can be a laterally extending cavity having a lateral dimension that is greater than the vertical extent of the cavity. In other words, the lateral dimension of each backside recess (143, 243) can be greater than the height of the backside recess (143, 243). The inter-tier memory openings 49 and the inter-tier support openings 149 are herein referred to as front side openings or front side cavities in contrast with the backside recesses (143, 243). In one embodiment, the memory array region 100 comprises an array of monolithic three-dimensional NAND strings having a plurality of device levels disposed above the substrate (9, 10). In this case, each backside recess (143, 243) can define a space for receiving a respective word line of the array of monolithic three-dimensional NAND strings.

Each of the plurality of backside recesses (143, 243) can extend substantially parallel to the top surface of the substrate (9, 10). A backside recess (143, 243) can be vertically bounded by a top surface of an underlying insulating layer (132, 232) and a bottom surface of an overlying insulating layer (132, 232). In one embodiment, each backside recess (143, 243) can have a uniform height throughout.

Referring to FIGS. 12A and 12B, a backside blocking dielectric layer (not shown) can be optionally formed. The backside blocking dielectric layer, if present, comprises a dielectric material that functions as a control gate dielectric for the control gates to be subsequently formed in the backside recesses (143, 243). In case the blocking dielectric layer 52 is present within each memory opening, the backside blocking dielectric layer is optional. In case the blocking dielectric layer 52 is omitted, the backside blocking dielectric layer is present The backside blocking dielectric layer can be formed in the backside recesses (143, 243) and on a sidewall of the backside trench 79. The backside blocking dielectric layer can be formed directly on horizontal surfaces of the insulating layers (132, 232) and physically exposed sidewalls of the blocking dielectric 52 within the backside recesses (143, 243). If the backside blocking dielectric layer is formed, formation of the tubular dielectric spacers and the planar dielectric portion prior to formation of the backside blocking dielectric layer is optional. In one embodiment, the backside blocking dielectric layer can be formed by a conformal deposition process such as atomic layer deposition (ALD). The backside blocking dielectric layer can consist essentially of aluminum oxide. The thickness of the backside blocking dielectric layer can be in a range from 1 nm to 15 nm, such as 2 to 6 nm, although lesser and greater thicknesses can also be employed.

The dielectric material of the backside blocking dielectric layer can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer can include a silicon oxide layer. The backside blocking dielectric layer can be deposited by a conformal deposition method such as chemical vapor deposition or atomic layer deposition. The thickness of the backside blocking dielectric layer can be in a range from 1 nm to 10 nm, although lesser and greater thicknesses can also be employed. A backside cavity is present within the portion of each backside trench 79 that is not filled with the backside blocking dielectric layer.

At least one conducive material can be deposited to form electrically conductive layers (146, 246). The at least one conductive material can include a metallic liner and a conductive fill material layer. The metallic liner can include a metallic nitride material such as TiN, TaN, WN, an alloy thereof, or a stack thereof. The metallic liner functions as a diffusion barrier layer and an adhesion promotion layer. The metallic liner can be deposited by a conformal deposition method such as chemical vapor deposition (CVD) or atomic layer deposition (ALD), and can have a thickness in a range from 1 nm to 6 nm, although lesser and greater thicknesses can also be employed. The conductive fill material layer can be deposited directly on the metallic liner by a conformal deposition method such as chemical vapor deposition or atomic layer deposition. The conductive fill material layer includes a conductive material. The conductive material can include at least one elemental metal such as W, Cu, Co, Mo, Ru, Au, and Ag. Additionally or alternatively, the conductive fill material layer (146, 246) can include at least one intermetallic metal alloy material. Each intermetallic metal alloy material can include at least two metal elements selected from W, Cu, Co, Mo, Ru, Au, Ag, Pt, Ni, Ti, and Ta. In one embodiment, the conductive fill material layer can consist essentially of W, Co, Mo, or Ru.

Each portion of the at least one conducive material that fills a backside recess (143 or 243) constitutes an electrically conductive layer (146 or 246). The electrically conductive layers (146, 246) include first electrically conductive layers 146 that are formed in the first backside recesses 143 in the first tier structure, and second electrically conductive layers 246 that are formed in the second backside recesses 243 in the second tier structure. The portion of the at least one conductive material that excludes the electrically conductive layers (146, 246) constitutes continuous metallic material layer 46L. A plurality of electrically conductive layers (146, 246) can be formed in the plurality of backside recesses (143, 243), and the continuous metallic material layer 46L can be formed on the sidewalls of each backside trench 79 and over the contact level dielectric layer 80. A backside cavity is present in the portion of each backside trench 79 that is not filled with the backside blocking dielectric layer and the continuous metallic material layer 46L.

While the backside recesses (143, 243) remain as cavities, i.e., between removal of the sacrificial material layers (142, 242) and formation of the electrically conductive layers (146, 246) in the backside recesses (143, 243), the support pillar structures 20, and the memory stack structures 55 support the first and second insulating layers (132, 142), the insulating cap layer 70, and the contact level dielectric layer 80. Thus, each first sacrificial material layer 142 can be replaced with a respective first electrically conductive layer 146, and each second sacrificial material layer 242 can be replaced with a respective second electrically conductive layer 246, while the support pillar structures 20 and the memory stack structures 55 provide structural support to the first and second insulating layers (132, 232).

Referring to FIGS. 13A and 13B, the deposited metallic material of the continuous electrically conductive material layer 46L is etched back from the sidewalls of each backside trench 79 and from above the contact level dielectric layer 80, for example, by an isotropic wet etch, an anisotropic dry etch, or a combination thereof. The electrically conductive layers (146, 246) in the backside recesses are not removed by the etch process. In one embodiment, the sidewalls of each electrically conductive layer (146 or 246) can be vertically coincident after removal of the continuous electrically conductive material layer 46L.

Each electrically conductive layer (146 or 246) can function as a combination of a plurality of control gate electrodes located at a same level and a word line electrically interconnecting, i.e., electrically shorting, the plurality of control gate electrodes located at the same level. The plurality of control gate electrodes within each electrically conductive layer (146 or 246) are the control gate electrodes for the vertical memory devices including the memory stack structures 55. In other words, each electrically conductive layer (146 or 246) can be a word line that functions as a common control gate electrode for the plurality of vertical memory devices.

Figure 14A:
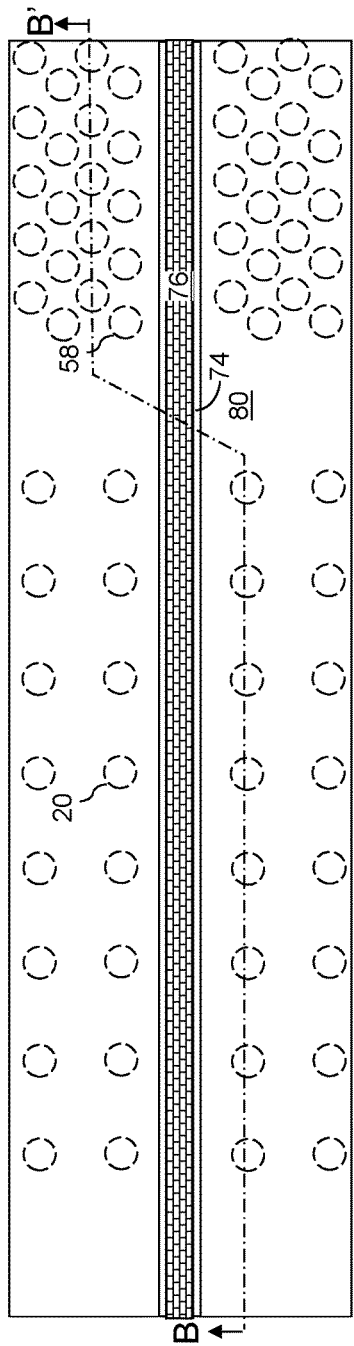
FIG. 14A is a schematic top-down view of a region of the exemplary structure after formation of an insulating spacer, a source region, and a backside contact via structure according to an embodiment of the present disclosure.
Figure 14B:
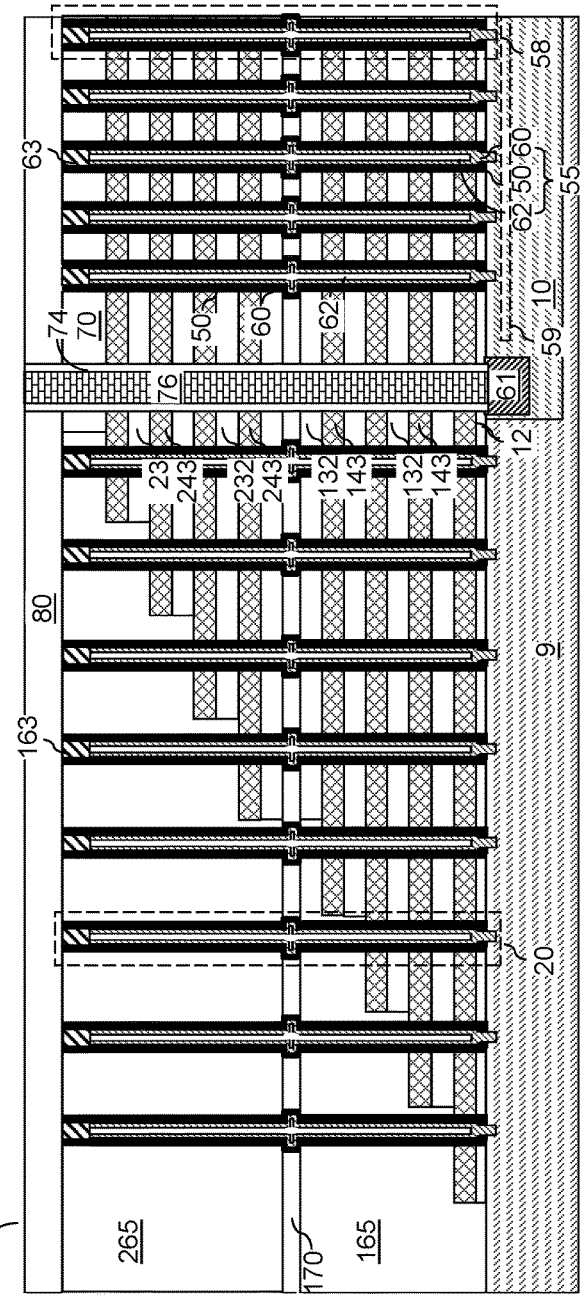
FIG. 14B is a schematic vertical cross-sectional view along the vertical plane B-B' of the region of the exemplary structure of FIG. 14A.

Referring to FIGS. 14A and 14B, an insulating material layer can be formed in the at least one backside trench 79 and over the contact level dielectric layer 80 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed. An anisotropic etch is performed to remove horizontal portions of the insulating material layer from above the contact level dielectric layer 80 and at the bottom of each backside trench 79. Each remaining portion of the insulating material layer constitutes an insulating spacer 74. The anisotropic etch can continue to etch through physically exposed portions of the planar dielectric portion, if present, in each backside trench 79. Thus, an insulating spacer 74 is formed in each backside trench 79 directly on physically exposed sidewalls of the electrically conductive layers (146, 246).

A source region 61 can be formed underneath each backside trench 79 by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can contact a bottom surface of the insulating spacer 74. An upper portion of the semiconductor material layer 10 between the source region 61 and the memory stack structures 55 constitutes a horizontal semiconductor channel 59.

A backside contact via structure 76 can be formed within each cavity. Each contact via structure 76 can fill a respective cavity. The backside contact via structures 76 can be formed by depositing at least one conductive material in the remaining unfilled volume (i.e., the backside cavity) of the backside trench 79. For example, the at least one conductive material can include a conductive liner (not expressly shown) and a conductive fill material portion (not expressly shown). The conductive liner can include a metallic liner such as TiN, TaN, WN, TiC, TaC, WC, an alloy thereof, or a stack thereof. The thickness of the conductive liner can be in a range from 3 nm to 30 nm, although lesser and greater thicknesses can also be employed. The conductive fill material portion can include a metal or a metallic alloy. For example, the conductive fill material portion can include W, Cu, Al, Co, Ru, Ni, an alloy thereof, or a stack thereof.

The at least one conductive material can be planarized employing the contact level dielectric layer 80 overlying the alternating stack (132, 146, 232, 246)) as a stopping layer. If chemical mechanical planarization (CMP) process is employed, the contact level dielectric layer 80 can be employed as a CMP stopping layer. Each remaining continuous portion of the at least one conductive material in the backside trenches 79 constitutes a backside contact via structure 76. Each backside contact via structure 76 can be formed directly on a top surface of a source region 61. Each backside contact via structure 76 can contact a respective source region 61, and can be laterally surrounded by a respective insulating spacer 74.

An activation anneal process can be performed after formation of the source region 61 to active the electrical dopants in the source region 61. A rapid thermal anneal (RTA) process can be employed to active the dopants in the source region 61, the drain regions 63, and in the vertical semiconductor channels 60, if any. The duration of the time period during the rapid thermal anneal process in which the temperature of the exemplary structure exceeds 750 degrees Celsius is limited to 60 seconds or less, and preferably 30 seconds or less (such as 15 seconds or less) to minimize distortion of the second alternating stack (232, 246, 70, 265) due to loss of hydrogen atoms therein.

Referring to FIGS. 15A and 15B, additional contact via structures (88, 86) can be formed through the contact level dielectric layer 80 and through the retro-stepped dielectric material portions (165, 265). For example, drain contact via structures 88 can be formed through the contact level dielectric layer 80 on each drain region 63. Each drain contact via structure 88 can be formed through the contact level dielectric layer 80 on each of the drain regions 63, while not forming any conductive structure through the contact level dielectric layer 80 over the doped semiconductor material portions of the dummy drain regions 163.

Control gate contact via structures 86 can be formed in the terrace region on the electrically conductive layers (146, 246) through the contact level dielectric layer 80, and through the retro-stepped dielectric material portions (165, 265). The control gate contact via structures 86 vertically extend at least through a dielectric material portion (i.e., the second retro-stepped dielectric material portion 265) within the second tier structure (232, 246, 265, 70), and contact a respective electrically conductive layer selected from the first and second electrically conductive layers (146, 246). Peripheral gate contact via structures (not shown) and peripheral active region contact via structures (not shown) can be formed through the retro-stepped dielectric material portions (165, 265) directly on respective nodes of the peripheral devices 700 shown in FIG. 1.

In summary, in some embodiments of the present disclosure method of forming a three-dimensional memory device comprises forming a first tier structure comprising a first alternating stack of first insulating layers 132 and first spacer layers 142 over a substrate (9, 10), forming first memory openings 121 through the first alternating stack, forming sacrificial memory opening fill structures 123 in the first memory openings, forming a second alternating stack of second insulating layers 232 and second spacer layers 242 over the memory opening fill structures in the first tier structure, forming second memory openings 181 through the second alternating stack to expose the sacrificial memory opening fill structures 123, forming inter-tier memory openings 49 by removing the sacrificial memory opening fill structures 123 through the second memory openings 181, and forming a plurality of memory stack structures 55 extending through the first tier structure and the second tier structure. In one embodiment, a highest temperature of each thermal cycle during formation of the second tier structure is lower than a highest temperature of each thermal cycle during formation of the first tier structure.

In another embodiment, a highest temperature between the steps of forming the first alternating stack (132, 142) and the forming the sacrificial memory opening fill structures 132 is at least 800 degrees Celsius, and a highest temperature between the steps of forming the second alternating stack (232, 242) and forming the inter-tier memory openings 49 is below 800 degrees Celsius. Thus, the highest temperature of each thermal cycle between the steps of forming the second alternating stack (232, 242) and forming the inter-tier memory openings 49 is lower than the highest temperature of each thermal cycle between the steps of forming the first alternating stack (132, 242) and the forming the sacrificial memory opening fill structures 132.

At least one anneal process is performed at a temperature of at least 800 degrees Celsius between the steps of forming the first alternating stack (132, 242) and the forming the sacrificial memory opening fill structures 132. In one embodiment, the at least one anneal process comprises a first anneal process at a temperature of at least 800 degrees Celsius after the step of forming the first alternating stack (132, 142), and a second anneal process at a temperature of at least 800 degrees Celsius after the step forming the first retro-stepped dielectric material portion 165. In contrast, no anneal process at a temperature of at least 800 degrees Celsius is performed between the steps of forming the second alternating stack (232, 242) and forming the inter-tier memory openings 49 to reduce or avoid misalignment of the respective first 121 and second 181 memory openings.

Referring back to FIGS. 15A and 15B, the exemplary structure of the present disclosure can include a monolithic three-dimensional memory device. The three-dimensional memory device can include a first tier structure (12, 132, 146, 165) comprising a first alternating stack (132, 146) of first insulating layers 132 and first electrically conductive layers 146 located over a substrate (9, 10); a second tier structure (232, 246, 70, 265) comprising a second alternating stack (232, 246) of second insulating layers 232 and second electrically conductive layers 246 located over the first tier structure (12, 132, 146, 165); and a plurality of memory stack structures 55 extending through the first tier structure (12, 132, 146, 165) and the second tier structure (232, 246, 70, 265). The first insulating layers 132 comprise a first silicon oxide material including hydrogen atoms at a first atomic concentration, and the second insulating layers 232 comprise a second silicon oxide material including hydrogen atoms at a second atomic concentration that is at least 1 atomic percent greater than the first atomic concentration.

In one embodiment, the first atomic concentration can be within a range from 0.1% to 2.0%, such as from 0.1% to 0.5% or from 0.5% to 1.0% or from 1.0% to 2.0%, and the second atomic concentration is within a range from 3.0% to 12.0%, such as from 3.0% to 5.0% or from 5.0% to 7.5% or from 7.5% to 10.0% or from 10.0% to 12.0%.

In one embodiment, each of the first insulating layers 132 and the second insulating layers 232 includes carbon atoms, and the first insulating layers 132 and the second insulating layers 232 have a same atomic ratio of carbon atoms to silicon atoms.

In one embodiment, the first alternating stack (132, 146) has a first terrace region in which underlying layers within the first alternating stack (132, 146) laterally extend farther than overlying layers within the first alternating stack (132, 146). The second alternating stack (232, 246) has a second terrace region in which underlying layers within the second alternating stack (232, 246) laterally extend farther than overlying layers within the second alternating stack (232, 246).

In one embodiment, the first tier structure (12, 132, 146, 165) comprises a first retro-stepped dielectric material portion 165 overlying the first terrace region and comprising a first silicon oxide fill material, and the second tier structure (232, 246, 70, 265) comprises a second retro-stepped dielectric material portion 265 overlying the second terrace region and comprising a second silicon oxide fill material. The second silicon oxide fill material can include hydrogen atoms at an atomic concentration that is at least 1 atomic percent greater than an atomic concentration of hydrogen atoms in the first silicon oxide fill material. In one embodiment, the first silicon oxide fill material includes carbon at an atomic concentration within a range from 0.1% to 2.0%, such as from 0.1% to 0.5% or from 0.5% to 1.0% or from 1.0% to 2.0%. The second silicon oxide fill material includes carbon at an atomic concentration within range from 3.0% to 12.0%, such as from 3.0% to 5.0% or from 5.0% to 7.5% or from 7.5% to 10.0% or from 10.0% to 12.0%.

The first silicon oxide fill material of the first retro-stepped dielectric material portion 165 undergoes a greater shrinkage in volume through high temperature cycling than the second silicon oxide fill material of the second retro-stepped dielectric material portion 265, and thus, applies more stress to surrounding structures than the second retro-stepped dielectric material portion 265 does. In one embodiment, a stress that the first retro-stepped dielectric material portion 165 applies to the first alternating stack (132, 146) has a greater magnitude than a stress that the second retro-stepped dielectric material portion 265 applies to the second alternating stack (232, 246).

The monolithic three-dimensional memory device can further comprise first control gate contact via structures 86 vertically extending through the first and second retro-stepped dielectric material portions (165, 265) and contacting a respective one of the first electrically conductive layers 146; and second control gate contact via structures 86 vertically extending through the second retro-stepped dielectric material portion 265 and contacting a respective one of the second electrically conductive layers 246.

Due to a greater degree of densification, and more loss of hydrogen atoms, in the first insulating layers 132 than in the second insulating layers 232, the etch rate of the second silicon oxide material of the second insulating layers 232 in a 100:1 diluted hydrofluoric acid can be greater than the etch rate of the first silicon oxide material of the first insulating layers 132 in the 100:1 diluted hydrofluoric acid. In one embodiment, the ratio of the etch rate of the second silicon oxide material in a 100:1 diluted hydrofluoric acid to the etch rate of the first silicon oxide material in the 100:1 diluted hydrofluoric acid can be in a range from 2 to 200.

In one embodiment, each of the first and second electrically conductive layers (146, 246) comprises a word line of a same electrically conductive material. Each of the plurality of memory stack structures 55 comprises, from outside to inside, a memory film 50 and a vertical semiconductor channel 60.

A terrace region can be provided in the contact region 200. In the terrace region, each electrically conductive layer (146, 246) other than a topmost electrically conductive layer (146, 246) within the second alternating stack (232, 246) laterally extends farther than overlying electrically conductive layers (146, 246) within the first and second alternating stacks (132, 146, 232, 246). The terrace region includes stepped surfaces of the first and second alternating stacks (132, 146, 232, 246) that continuously extend from a bottommost layer within the first alternating stack (132, 146) to a topmost layer within the second alternating stack (232, 246); and the support pillar structures 20 are located in the terrace region.

The monolithic three-dimensional memory device can further include control gate contact via structures 86 located within the terrace region, vertically extending at least through a dielectric material portion (i.e., the second retro-stepped dielectric material portion 265) within the second tier structure (232, 246, 265, 70), and contacting a respective electrically conductive layer (146 or 246) selected from the first and second electrically conductive layers (146, 246).

In one embodiment, the first tier structure (132, 146, 165) further comprises a first dielectric material portion (i.e., a first retro-stepped dielectric material portion 165) located over first stepped surfaces of the first alternating stack (132, 146). The second tier structure (232, 246, 265, 70) further comprises a second dielectric material portion (i.e., a second retro-stepped dielectric material portion 265) located over second stepped surfaces of the second alternating stack (232, 246). The first stepped surfaces and the second stepped surfaces are located within a contact region 200.

In one embodiment, the monolithic three-dimensional memory structure comprises a monolithic three-dimensional NAND memory device. The first and second electrically conductive layers (146, 246) can comprise, or can be electrically connected to, a respective word line of the monolithic three-dimensional NAND memory device. The substrate (9, 10) can comprise a silicon substrate. The monolithic three-dimensional NAND memory device can comprise an array of monolithic three-dimensional NAND strings over the silicon substrate. At least one memory cell (as embodied as a portion of a charge storage layer 54 at a level of an electrically conductive layer (146 or 246)) in a first device level of the array of monolithic three-dimensional NAND strings can be located over another memory cell (as embodied as another portion of a charge storage layer 54 at a level of another electrically conductive layer (146 or 246)) in a second device level of the array of monolithic three-dimensional NAND strings. The silicon substrate can contain an integrated circuit comprising a driver circuit for the memory device located thereon. The electrically conductive layers (146, 246) can comprise a plurality of control gate electrodes having a strip shape extending substantially parallel to the top surface of the substrate (9, 10). The plurality of control gate electrodes comprises at least a first control gate electrode located in a first device level and a second control gate electrode located in a second device level. The array of monolithic three-dimensional NAND strings can comprise: a plurality of semiconductor channels (59, 60), wherein at least one end portion 60 of each of the plurality of semiconductor channels (59, 60) extends substantially perpendicular to a top surface of the substrate (9, 10); and a plurality of charge storage elements (as embodied as portions of the charge storage layer 54 that are located at each level of the electrically conductive layers (146, 246)). Each charge storage element can be located adjacent to a respective one of the plurality of semiconductor channels (59, 60).

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A monolithic three-dimensional memory device, comprising:
    a first tier structure comprising a first alternating stack of first insulating layers and first electrically conductive layers located over a substrate;
    a second tier structure comprising a second alternating stack of second insulating layers and second electrically conductive layers and located over the first tier structure; and
    a plurality of memory stack structures extending through the first tier structure and the second tier structure,
    wherein:
    the first insulating layers comprise a first silicon oxide material including hydrogen atoms at a first atomic concentration; and
    the second insulating layers comprise a second silicon oxide material including hydrogen atoms at a second atomic concentration that is at least 1 atomic percent greater than the first atomic concentration.

2. The monolithic three-dimensional memory device of claim 1, wherein:
    the first atomic concentration is within a range from 0.1% to 2.0%; and
    the second atomic concentration is within a range from 3.0% to 12.0%.

3. The monolithic three-dimensional memory device of claim 1, wherein:
    each of the first insulating layers and the second insulating layers includes carbon atoms; and
    the first insulating layers and the second insulating layers have a same atomic ratio of carbon atoms to silicon atoms.

4. The monolithic three-dimensional memory device of claim 1, wherein:
    the first alternating stack has a first terrace region in which underlying layers within the first alternating stack laterally extend farther than overlying layers within the first alternating stack;
    the second alternating stack has a second terrace region in which underlying layers within the second alternating stack laterally extend farther than overlying layers within the second alternating stack;
    the first tier structure comprises a first retro-stepped dielectric material portion overlying the first terrace region and comprising a first silicon oxide fill material; and
    the second tier structure comprises a second retro-stepped dielectric material portion overlying the second terrace region and comprising a second silicon oxide fill material,
    wherein the second silicon oxide fill material includes hydrogen atoms at an atomic concentration that is at least 1 atomic percent greater than an atomic concentration of hydrogen atoms in the first silicon oxide fill material.

5. The monolithic three-dimensional memory device of claim 4, wherein:
    the first silicon oxide fill material includes hydrogen at an atomic concentration within a range from 0.1% to 2.0%; and
    the second silicon oxide fill material includes hydrogen at an atomic concentration within range from 3.0% to 12.0%.

6. The monolithic three-dimensional memory device of claim 5, wherein a stress that the first retro-stepped dielectric material portion applies to the first alternating stack has a greater magnitude than a stress that the second retro-stepped dielectric material portion applies to the second alternating stack.

7. The monolithic three-dimensional memory device of claim 5, further comprising:
    first control gate contact via structures vertically extending through the first and second retro-stepped dielectric material portions and contacting a respective one of the first electrically conductive layers; and
    second control gate contact via structures vertically extending through the second retro-stepped dielectric material portion and contacting a respective one of the second electrically conductive layers.

8. The monolithic three-dimensional memory device of claim 1, wherein a ratio of an etch rate of the second silicon oxide material in a 100:1 diluted hydrofluoric acid to an etch rate of the first silicon oxide material in the 100:1 diluted hydrofluoric acid is in a range from 2 to 200.

9. The monolithic three-dimensional memory device of claim 1, wherein:
    each of the first and second electrically conductive layers comprises a word line of a same electrically conductive material; and
    each of the plurality of memory stack structures comprises, from outside to inside, a memory film and a vertical semiconductor channel.

10. The monolithic three-dimensional memory device of claim 1, wherein:
    the monolithic three-dimensional memory device comprises a monolithic three-dimensional NAND memory device;
    the first and second electrically conductive layers comprise, or are electrically connected to, a respective word line of the monolithic three-dimensional NAND memory device;
    the substrate comprises a silicon substrate;
    the monolithic three-dimensional NAND memory device comprises an array of monolithic three-dimensional NAND strings over the silicon substrate;
    at least one memory cell in a first device level of the array of monolithic three-dimensional NAND strings is located over another memory cell in a second device level of the array of monolithic three-dimensional NAND strings;
    the silicon substrate contains an integrated circuit comprising a driver circuit for the memory device located thereon;

the electrically conductive layers comprise a plurality of control gate electrodes having a strip shape extending substantially parallel to the top surface of the substrate, the plurality of control gate electrodes comprise at least a first control gate electrode located in the first device level and a second control gate electrode located in the second device level; and the array of monolithic three-dimensional NAND strings comprises:
- a plurality of semiconductor channels, wherein at least one end portion of each of the plurality of semiconductor channels extends substantially perpendicular to a top surface of the substrate; and
- a plurality of charge storage elements, each charge storage element located adjacent to a respective one of the plurality of semiconductor channels.

\* \* \* \* \*